(12) United States Patent
Hogyoku

(10) Patent No.: US 11,043,436 B2
(45) Date of Patent: Jun. 22, 2021

(54) SEMICONDUCTOR DEVICE, MANUFACTURING METHOD, IMAGING DEVICE, AND ELECTRONIC APPARATUS FOR ENABLING COMPONENT MOUNTING WITH HIGH FLATNESS

(71) Applicant: SONY CORPORATION, Tokyo (JP)

(72) Inventor: Susumu Hogyoku, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 25 days.

(21) Appl. No.: 16/070,383

(22) PCT Filed: Jan. 20, 2017

(86) PCT No.: PCT/JP2017/001852
§ 371 (c)(1),
(2) Date: Jul. 16, 2018

(87) PCT Pub. No.: WO2017/135062
PCT Pub. Date: Aug. 10, 2017

(65) Prior Publication Data
US 2019/0019737 A1  Jan. 17, 2019

(30) Foreign Application Priority Data

Feb. 3, 2016  (JP) .............................. JP2016-018881

(51) Int. Cl.
| | | |
|---|---|---|
| *H01L 23/15* | (2006.01) | |
| *H05K 3/46* | (2006.01) | |
| *H01L 27/146* | (2006.01) | |
| *H05K 1/02* | (2006.01) | |
| *H01L 21/48* | (2006.01) | |
| *H01L 23/498* | (2006.01) | |

(52) U.S. Cl.
CPC .......... *H01L 23/15* (2013.01); *H01L 21/4857* (2013.01); *H01L 23/49822* (2013.01);
(Continued)

(58) Field of Classification Search
CPC ............... H01L 23/15; H01L 27/14618; H01L 27/14625; H01L 21/4857; H01L 23/49822;
(Continued)

(56) References Cited

U.S. PATENT DOCUMENTS

| | | | | |
|---|---|---|---|---|
| 2005/0161587 | A1* | 7/2005 | Mihara | ............... H01L 21/6835 |
| | | | | 250/214 R |
| 2005/0169620 | A1 | 8/2005 | Minamio et al. | |

(Continued)

FOREIGN PATENT DOCUMENTS

| | | |
|---|---|---|
| CN | 1652341 A | 8/2005 |
| CN | 101369593 A | 2/2009 |

(Continued)

OTHER PUBLICATIONS

International Search Report and Written Opinion of PCT Application No. PCT/JP2017/001852, dated Mar. 28, 2017, 09 pages of ISRWO.

*Primary Examiner* — Mohammad M Hoque
(74) *Attorney, Agent, or Firm* — Chip Law Group

(57) ABSTRACT

The present technology relates to a semiconductor device and a manufacturing method, an imaging device, and an electronic apparatus that enable component mounting with high flatness at low cost. A semiconductor device includes: a core substrate: a multilayer wiring layer that includes a plurality of conductive layers and a plurality of insulating layers, and is formed on a surface of the core substrate; an opening that is formed in the multilayer wiring layer, and penetrates through at least the outermost insulating layer farthest from the core substrate among the plurality of insulating layers; and a mount element connected to a pad portion provided on a predetermined conductive layer located closer to the core substrate than the outermost conductive layer farthest from the core substrate among the
(Continued)

plurality of conductive layers in the opening. The present technology can be applied to imaging devices.

6 Claims, 32 Drawing Sheets

(52) U.S. Cl.
CPC ...... *H01L 27/146* (2013.01); *H01L 27/14618* (2013.01); *H01L 27/14625* (2013.01); *H01L 27/14627* (2013.01); *H01L 27/14636* (2013.01); *H05K 1/0274* (2013.01); *H05K 3/4605* (2013.01); *H01L 2224/16225* (2013.01); *H01L 2224/73204* (2013.01); *H05K 2201/0108* (2013.01); *H05K 2201/09072* (2013.01); *H05K 2201/10121* (2013.01)

(58) Field of Classification Search
CPC ......... H01L 27/14627; H01L 27/14636; H01L 2224/73204; H01L 2224/16225; H01L 27/146–14893; H01L 21/823406; H01L 27/1057; H01L 29/765–76891; H01L 29/66946–66962; H05K 3/4605; H05K 1/0274; H05K 2201/10121; H05K 2201/09072; H05K 2201/0108
USPC .......................................................... 257/432
See application file for complete search history.

(56) References Cited

U.S. PATENT DOCUMENTS

| | | | |
|---|---|---|---|
| 2008/0055438 A1* | 3/2008 | Lee ..................... | H01L 31/0203 348/294 |
| 2008/0211075 A1* | 9/2008 | Yang ................. | H01L 27/14618 257/680 |
| 2008/0303107 A1 | 12/2008 | Minamio et al. | |
| 2009/0053850 A1* | 2/2009 | Nishida ............. | H01L 27/14618 438/64 |
| 2009/0309202 A1* | 12/2009 | Hsu ...................... | H01L 23/3128 257/680 |
| 2010/0288550 A1* | 11/2010 | Nagamatsu ............. | H01L 23/13 174/262 |
| 2011/0080516 A1* | 4/2011 | Yi ......................... | H04N 5/2253 348/374 |
| 2011/0193231 A1* | 8/2011 | Elenius ................. | H01L 23/564 257/750 |
| 2011/0254156 A1* | 10/2011 | Lin ....................... | H01L 21/566 257/737 |
| 2012/0112329 A1* | 5/2012 | Yen ..................... | H01L 23/3171 257/666 |
| 2013/0210198 A1* | 8/2013 | Lin ................... | H01L 23/49827 438/126 |
| 2014/0203397 A1* | 7/2014 | Yen ..................... | H01L 25/0657 257/531 |
| 2015/0223330 A1 | 8/2015 | Oi et al. | |
| 2015/0270243 A1* | 9/2015 | Yang .................. | H01L 23/5384 438/118 |
| 2016/0315067 A1* | 10/2016 | Chou .................. | H01L 23/3142 |
| 2017/0098628 A1* | 4/2017 | Liu ....................... | H01L 21/568 |

FOREIGN PATENT DOCUMENTS

| | | |
|---|---|---|
| EP | 1560271 A2 | 8/2005 |
| JP | 2005-252223 A | 9/2005 |
| JP | 2008-305972 A | 12/2008 |
| JP | 4820388 B2 | 11/2011 |
| JP | 2015-149325 A | 8/2015 |
| KR | 10-2005-0078634 A | 8/2005 |
| TW | 200527686 A | 8/2005 |

\* cited by examiner

FIG. 11
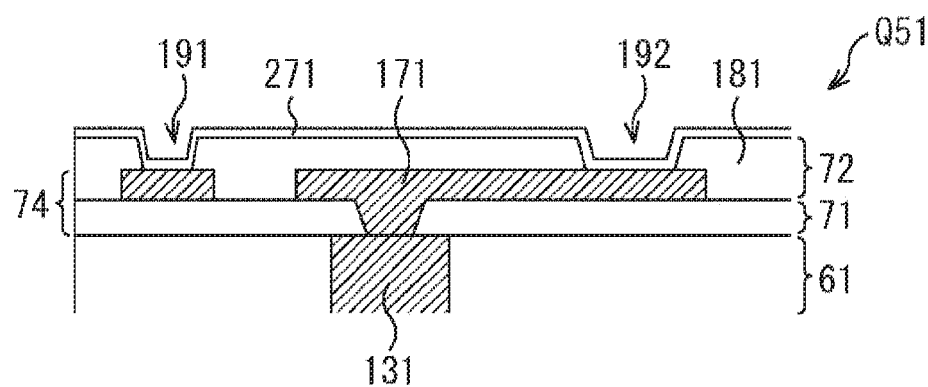
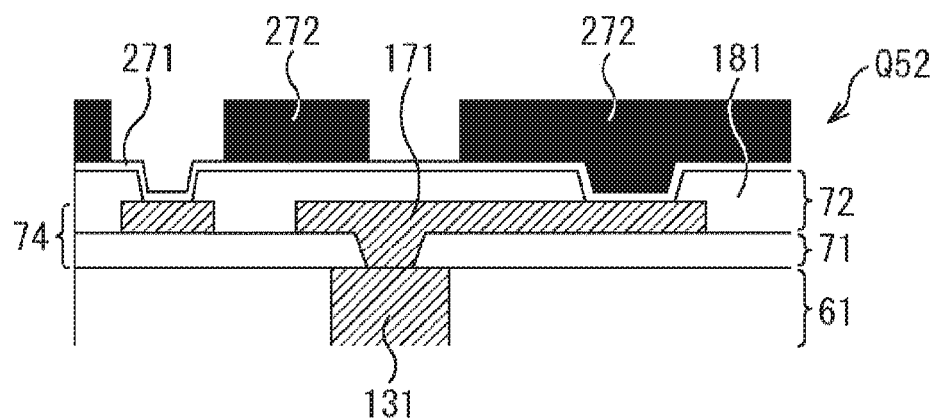

SEMICONDUCTOR DEVICE, MANUFACTURING METHOD, IMAGING DEVICE, AND ELECTRONIC APPARATUS FOR ENABLING COMPONENT MOUNTING WITH HIGH FLATNESS

CROSS REFERENCE TO RELATED APPLICATIONS

This application is a U.S. National Phase of International Patent Application No. PCT/JP2017/001852 filed on Jan. 20, 2017, which claims priority benefit of Japanese Patent Application No. JP 2016-018881 filed in the Japan Patent Office on Feb. 3, 2016. Each of the above-referenced applications is hereby incorporated herein by reference in its entirety.

TECHNICAL FIELD

The present technology relates to a semiconductor device and a manufacturing method, an imaging device, and an electronic apparatus, and more particularly, to a semiconductor device and a manufacturing method, an imaging device, and an electronic apparatus that enable component mounting with high flatness at low cost.

BACKGROUND ART

For example, imaging elements such as charge coupled devices (CCDs) and complementary metal oxide semiconductor (CMOS) image sensors to which a semiconductor microfabrication technology is applied have been widely adopted for digital cameras, mobile phones, and the like.

These imaging elements to which lens structures are attached are mounted as camera modules on electronic apparatuses. Meanwhile, to reduce the size and the weight of such a camera module, a mount package structure for image sensors has been suggested. In this mount package structure, a sensor chip, or an imaging element, is mounted on a glass wiring board by flip-chip mounting.

A wiring board for conventional flip-chip mounting, including such a glass wiring board, is formed by stacking build-up wiring layers on both surfaces of a core substrate and forming through electrodes in the core substrate to make the front and back wiring layers conductive.

As an example of such a technology, there is a suggested method by which build-up wiring layers are stacked on both surfaces of a core substrate, through electrodes are formed in the core substrate to make the front and back wiring layers conductive, and the mount portions of the element in the build-up wiring layers are then removed (see Patent Document 1, for example).

By this technique, to mount an element on a substrate in a low-profile manner, a release sheet is formed beforehand in a lower layer portion of a build-up wiring layer that is to serve as an element mounting portion, and, after the built-up wiring layer is stacked on the release sheet, part of the build-up wiring layer is removed with the use of the release sheet.

As a result, it is possible to perform low-profile mounting of an element in a position close to the core substrate in the substrate thickness direction. Further, taking advantage of the physical properties of the material of the core substrate, it is possible to increase reliability by reducing flat mounting of an element and linear expansion coefficient mismatch of the element.

CITATION LIST

Patent Document

Patent Document 1: Japanese Patent No. 4820388

SUMMARY OF THE INVENTION

Problems to be Solved by the Invention

Meanwhile, in a case where an imaging element is mounted on a substrate such as a glass wiring board, element mounting with high flatness is required so that preferred imaging characteristics can be achieved.

For example, if an imaging element is mounted in a tilted state on a substrate, or warpage occurs in a mounted imaging element, defocusing of light incident on the imaging element occurs, or the quality of an image to be formed by imaging becomes lower.

By the above described technique, however, it is difficult to mount components such as an imaging element with high flatness and at low cost.

For example, in a method by which part of a build-up wiring layer is removed with a release sheet so that an imaging element is mounted on an insulating layer close to the core substrate as in the technique described in Patent Document 1, the step of removing the wiring layer is added to a conventional manufacturing process, and the manufacturing cost will increase accordingly. Also, since the removed portion of the build-up wiring layer cannot be reused and is discarded, the material cost will also rise.

The present technology has been made in view of such circumstances, and aims to realize component mounting with high flatness at low cost.

Solutions to Problems

A manufacturing method according to a first aspect of the present technology is a method of manufacturing a semiconductor device that includes: a core substrate; a multilayer wiring layer that includes a plurality of conductive layers and a plurality of insulating layers and is formed on a surface of the core substrate; an opening that is formed in the multilayer wiring layer and penetrates through at least the outermost insulating layer farthest from the core substrate among the plurality of insulating layers; and a mount element connected to a pad portion provided on a predetermined conductive layer located closer to the core substrate than the outermost conductive layer farthest from the core substrate among the plurality of conductive layers in the opening. The manufacturing method includes the steps of: forming a resist pattern on a seed metal formed on an adjacent insulating layer so that a resist is applied to an opening portion formed in the adjacent insulating layer adjacent to the predetermined conductive layer; forming a conductive layer adjacent to the predetermined conductive layer by removing the seed metal on the adjacent insulating layer including the opening portion, after plating is performed and the resist is removed; and forming the opening after the outermost insulating layer is formed.

The manufacturing method may further include the step of forming a protective resin at a connecting portion between the mount element and the pad in the opening, the protective resin protecting the connecting portion.

The opening in a groove-like shape may be formed in the multilayer wiring layer so as to surround a region facing the mount element.

A plurality of the openings may be formed in the multilayer wiring layer so as to surround the region facing the mount element, and an air passage that connects the region surrounded by the opening and facing the mount element to the outside may be formed between the openings adjacent to each other.

The air passage may be sealed with another resin different from the protective resin.

The mount element may be an imaging element, the core substrate may be formed with a material having light transmission properties, the imaging element may be connected to the pad portion so that the light receiving portion of the imaging element faces the core substrate, and a light passing opening that guides light entering from the outside and passing through the core substrate to the light receiving portion of the imaging element may be formed at a portion of the multilayer wiring layer facing the imaging element.

The region facing the imaging element surrounded by the opening may be filled with a transparent resin.

The mount element and the pad may be connected by bump connection.

The thickness of one of the insulating layers forming the multilayer wiring layer may be greater than the thickness of the other insulating layer(s) forming the multilayer wiring layer.

In the manufacturing method according to the first aspect of the present technology, to manufacture a semiconductor device that includes: a core substrate; a multilayer wiring layer that includes a plurality of conductive layers and a plurality of insulating layers and is formed on a surface of the core substrate; an opening that is formed in the multilayer wiring layer and penetrates through at least the outermost insulating layer farthest from the core substrate among the plurality of insulating layers; and a mount element connected to a pad portion provided on a predetermined conductive layer located closer to the core substrate than the outermost conductive layer farthest from the core substrate among the plurality of conductive layers in the opening, a resist pattern is formed on a seed metal formed on an adjacent insulating layer so that a resist is applied to an opening portion formed in the adjacent insulating layer adjacent to the predetermined conductive layer, a conductive layer adjacent to the predetermined conductive layer is formed by removing the seed metal on the adjacent insulating layer including the opening portion after plating and removal of the resist, and the opening is formed after the formation of the outermost insulating layer.

A semiconductor device according to the first aspect of the present technology includes: a core substrate: a multilayer wiring layer that includes a plurality of conductive layers and a plurality of insulating layers and is formed on a surface of the core substrate; an opening that is formed in the multilayer wiring layer and penetrates through at least the outermost insulating layer farthest from the core substrate among the plurality of insulating layers; and a mount element connected to a pad portion provided on a predetermined conductive layer located closer to the core substrate than the outermost conductive layer farthest from the core substrate among the plurality of conductive layers in the opening.

A protective resin that protects a connecting portion between the mount element and the pad in the opening may be formed at the connecting portion.

The opening in a groove-like shape may be formed in the multilayer wiring layer so as to surround a region facing the mount element.

A plurality of the openings may be formed in the multilayer wiring layer so as to surround the region facing the mount element, and an air passage that connects the region surrounded by the opening and facing the mount element to the outside may be formed between the openings adjacent to each other.

The air passage may be sealed with another resin different from the protective resin.

The mount element may be an imaging element.

The core substrate may be formed with a material having light transmission properties, the imaging element may be connected to the pad portion so that the light receiving portion of the imaging element faces the core substrate, and a light passing opening that guides light entering from the outside and passing through the core substrate to the light receiving portion of the imaging element may be formed at a portion of the multilayer wiring layer facing the imaging element.

The region facing the imaging element surrounded by the opening may be filled with a transparent resin.

The mount element and the pad may be connected by bump connection.

The thickness of one of the insulating layers forming the multilayer wiring layer may be greater than the thickness of the other insulating layer(s) forming the multilayer wiring layer.

In the semiconductor device according to the first aspect of the present technology, a core substrate, a multilayer wiring layer that includes a plurality of conductive layers and a plurality of insulating layers and is formed on a surface of the core substrate, an opening that is formed in the multilayer wiring layer and penetrates through at least the outermost insulating layer farthest from the core substrate among the plurality of insulating layers, and a mount element connected to a pad portion provided on a predetermined conductive layer located closer to the core substrate than the outermost conductive layer farthest from the core substrate among the plurality of conductive layers in the opening are provided.

An electronic apparatus according to a second aspect of the present technology can be an electronic apparatus having a structure similar to the semiconductor device according to the first aspect of the present technology.

An imaging device according to a third aspect of the present technology includes: an imaging element; a core substrate: a multilayer wiring layer that includes a plurality of conductive layers and a plurality of insulating layers, and is formed on a surface of the core substrate; an opening that is formed in the multilayer wiring layer and penetrates through at least the outermost insulating layer farthest from the core substrate among the plurality of insulating layers; and a lens system that guides incident light to the imaging element, and is secured to the core substrate at a portion in the opening.

In the third aspect of the present technology, an imaging element, a core substrate, a multilayer wiring layer that includes a plurality of conductive layers and a plurality of insulating layers and is formed on a surface of the core substrate, an opening that is formed in the multilayer wiring layer and penetrates through at least the outermost insulating layer farthest from the core substrate among the plurality of insulating layers, and a lens system that guides incident light to the imaging element and is secured to the core substrate at a portion in the opening are provided.

Effects of the Invention

According to the first through third aspects of the present technology, component mounting with high flatness can be realized at low cost.

BRIEF DESCRIPTION OF DRAWINGS

FIG. 11 is a diagram for explaining the formation of a conductive layer.

MODES FOR CARRYING OUT THE INVENTION

The following is a description of embodiments to which the present technology is applied, with reference to the drawings.

First Embodiment

<Outline of the Present Technology>

The present technology is to enable mounting of mount elements (components), or particularly, semiconductor elements such as imaging elements, on a substrate with high flatness and at low cost.

Figure 1:
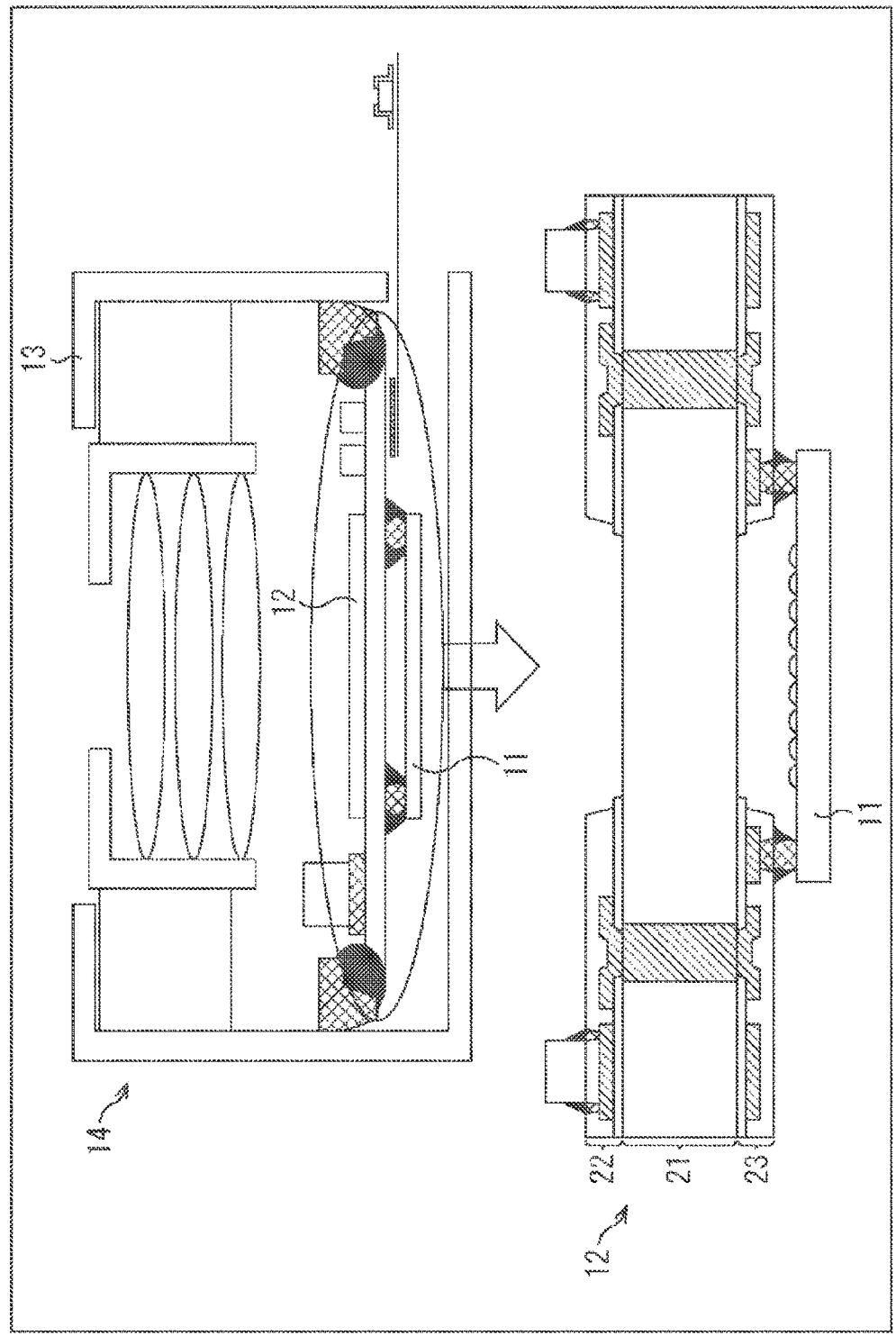
FIG. 1 is a diagram for explaining the structure of a conventional imaging device.

First, the present technology is explained. A camera module 14 that includes a glass wiring board 12 on which an imaging element 11 is mounted and a lens structure 13 attached to the glass wiring board 12 as shown in FIG. 1 is generally known, for example.

A mount package structure has also been suggested. In the mount package structure, the glass wiring board 12 is formed with a glass substrate 21, build-up wiring layers 22 and 23 stacked on both surfaces of the glass substrate 21, and an imaging element 11 is mounted on the wiring layer 23 by flip chip mounting.

In a case where the imaging element 11 is mounted on the glass wiring board 12, the imaging element 11 needs to maintain flatness to achieve preferred imaging characteristics as described above. Specifically, it is necessary to prevent warpage of the imaging element 11 and warpage of the glass wiring board 12, for example. Also, in the mounting of the imaging element 11, it is preferable to minimize costs.

Figure 2:
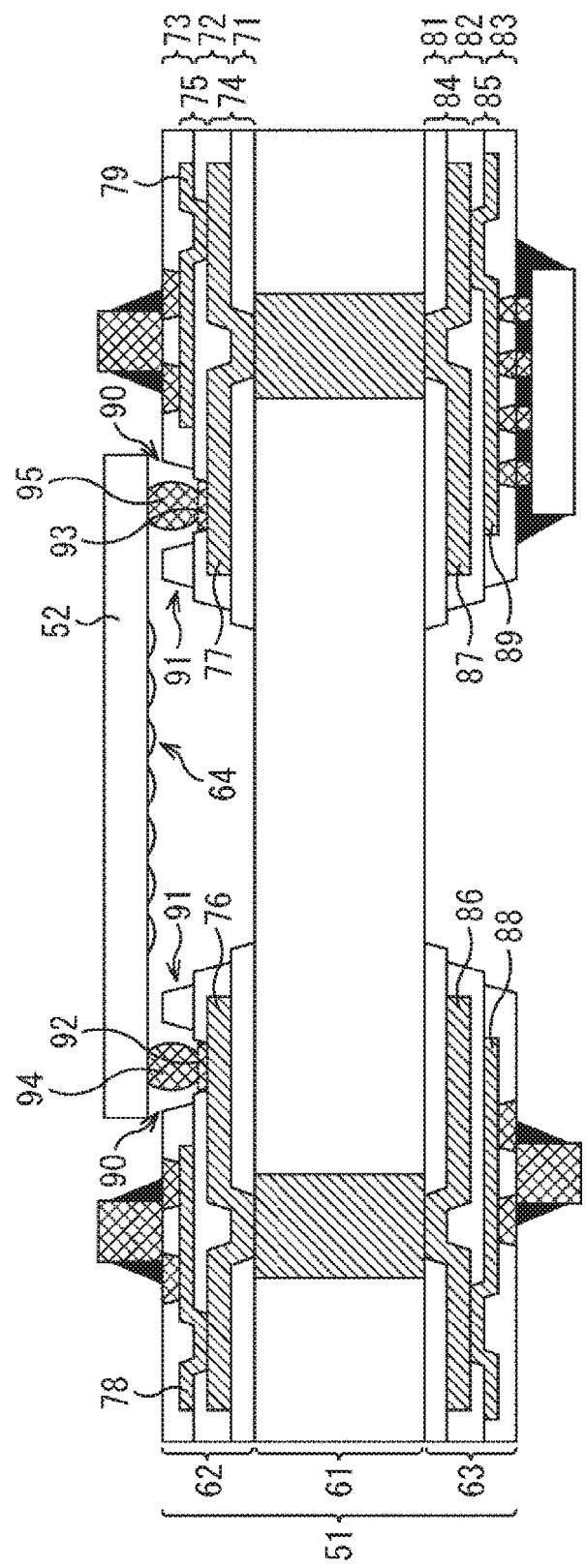
FIG. 2 is a diagram for explaining the present technology.

In view of this, the present technology enables low-cost component mounting with high flatness by bump-connecting an imaging element 52 directly to a conductive layer on the inner layer side of the outermost conductive layer of a glass wiring board 51 via a penetrating opening, as shown in FIG. 2, for example.

In this example, the glass wiring board 51 is formed with a transparent core substrate 61 including glass, and wiring layers 62 and 63 that are build-up multilayer wiring layers formed on both surfaces of the core substrate 61. Each of the wiring layers 62 and 63 includes a plurality of insulating layers and a plurality of conductive layers.

In addition, microlenses 64 are formed on the light receiving portion of the imaging element 52 that is an image sensor. With the light receiving portion facing a side of the glass wiring board 51, the imaging element 52 is mounted on the glass wiring board 51. That is, the imaging element 52 is mounted so that the light receiving portion of the imaging element 52 faces the glass wiring board 51.

The wiring layer 62 has a first insulating layer 71 located on the innermost layer side, which is the side of the core substrate 61, a second insulating layer 72 formed on the outer side of the insulating layer 71, and a third insulating layer 73 formed on the outermost side, which is the side farthest from the core substrate 61.

Further, a first conductive layer 74 is formed in the portions of the insulating layer 71 and the insulating layer 72 of the wiring layer 62, and a second conductive layer 75 is formed in the portions of the insulating layer 72 and the insulating layer 73.

In this example, the first conductive layer 74 located closest to the core substrate 61 is formed with a metal wiring line 76, a metal wiring line 77, and the like, and the second conductive layer 75 located on the outermost side, which is the side farthest from the core substrate 61, is formed with a metal wiring line 78, a metal wiring line 79, and the like.

Likewise, the wiring layer 63 includes a first insulating layer 81, a second insulating layer 82 formed on the outer side of the insulating layer 81, and a third insulating layer 83 formed on the outermost side.

Also, a first conductive layer 84 is formed in the portions of the insulating layer 81 and the insulating layer 82 of the wiring layer 63, and a second conductive layer 85 is formed in the portions of the insulating layer 82 and the insulating layer 83.

In this example, the first conductive layer 84 located closest to the core substrate 61 is formed with a metal wiring line 86, a metal wiring line 87, and the like, and the second conductive layer 85 located on the outermost side is formed with a metal wiring line 88, a metal wiring line 89, and the like.

Further, in the wiring layer 62, an opening 90 that penetrates the entire insulating layer 73, which is the outermost layer, and part of the insulating layer 72 is formed. It should be noted that the opening 90 should penetrate at least the outermost insulating layer 73, and be connectable to the conductive layer located closer to the core substrate 61 than the outermost conductive layer.

Particularly, in this example, the opening 90 is formed so as to surround the light receiving portion of the imaging element 52, and a protruding portion 91 that is a portion on the center side of the core substrate 61 from the opening 90 in the wiring layer 62, and the upper portion thereof is higher than the portion of the opening 90 in the drawing.

In other words, a groove that surrounds the portion of the glass wiring board 51 facing the imaging element 52 without any space is formed in the wiring layer 62, so that the opening 90 is formed. The portion of the opening 90 in the wiring layer 62 has a dam structure whose height is smaller than that of a portion adjacent to the opening 90, such as the protruding portion 91. That is, as the groove-like opening 90 is formed in the wiring layer 62, the protruding portion 91 adjacent to the opening 90 is formed.

In the wiring layer 62, pads 92 and pads 93 are also formed in portions of the metal wiring line 76 and the metal wiring line 77 located inside the opening 90, and the pads 92 and the pads 93 are electrically and physically connected to the imaging element 52 via bumps 94 and bumps 95.

In the present technology, the opening 90 is formed in the glass wiring board 51, and the imaging element 52 is bump-connected directly to the conductive layer 74 on the inner side of the outermost conductive layer 75. Thus, components such as the imaging element 52 can be mounted on the glass wiring board 51 with high flatness at low cost. Further, as the distance between the imaging element 52 and the core substrate 61 can be shortened, low-profile mounting of the imaging element 52 can also be realized.

That is, in a case where the opening 90, the pads 92, and the pads 93 are formed in mounting the imaging element 52 by bump connection, the opening 90, the pads 92, and the like are formed through the same number of steps as in a case where a conventional build-up wiring board is manufactured.

Accordingly, component mounting can be realized at low cost without an increase in the number of steps. Moreover, unlike a technique by which a component is mounted in a portion from which a build-up wiring layer is removed, this technique does not increase the removed portion of the wiring layer and cause a material cost increase.

Also, as the opening 90 is formed, it becomes possible to connect the imaging element 52 to the conductive layer 74 on the inner layer side closer to the flat core substrate 61 including a material such as glass having high rigidity. Thus, warpage in the imaging element 52 can be reduced, and mounting with high flatness can be realized.

Further, as the linear expansion coefficient of the glass forming the core substrate 61 and the linear expansion coefficient of the silicon forming the imaging element 52 are close to each other, the imaging element 52 and the core substrate 61 expand/contract in the lateral direction in the drawing substantially in the same manner when heat or the like is applied thereto, and stress is hardly applied to the bumps 94 and the bumps 95. That is, it is possible to alleviate the temperature cycle stress on the mount bump portions. As a result, it is possible to prevent the light receiving surface of the imaging element 52 from being distorted to lower flatness, or prevent the imaging element 52 from being subjected to a load to degrade imaging characteristics.

It should be noted that the material of the core substrate 61 can be selected so that the difference between the linear expansion coefficient of the material forming the core substrate 61 and the linear expansion coefficient of the material forming the imaging element 52, which is the semiconductor element to be mounted, becomes equal to or smaller than a predetermined threshold value, for example.

Further, in this example, the conductive layer 74 formed with the metal wiring line 76 and the like to which the imaging element 52 is connected is not formed directly on the core substrate 61 including glass, but the insulating layer 71 formed with a highly stretchable resin or inorganic film is provided between the conductive layer 74 and the core substrate 61.

In a case where the metal wiring line and the like 76 including a metal such as copper (Cu) is formed directly on the core substrate 61, for example, the difference in linear expansion coefficient between the metal wiring line 76 and the like and the core substrate 61 is large, and therefore, a load is applied to the core substrate 61, the bumps 94, the bumps 95, and the like when heat is applied thereto. In such a case, the core substrate 61, the bump portions, and the like might be damaged.

Therefore, the highly stretchable insulating layer 71 is provided between the conductive layer 74 and the core substrate 61 as in the present technology, so that the stress to be generated among the core substrate 61, the conductive layer 74, the bumps 94, and the like is reduced, and high flatness and high imaging characteristics can be maintained.

Also, in a case where the component to be mounted on the glass wiring board 51 is a semiconductor element such as the imaging element 52, the portion between the mounted component and the glass wiring board 51 may be sealed, to protect the surface of the mounted component from dust adhesion and the like. In the example shown in FIG. 2, an underfill such as a resin is applied to the portions of the bumps 94 and the bumps 95 by a dispenser or inkjet, to seal the light receiving portion of the imaging element 52.

In a case where the light receiving portion or the like of the imaging element 52 is sealed as described above, an underfill flowing into the light receiving portion or the like of the imaging element 52 results in degradation of the imaging characteristics or causes defects.

Examples of techniques for preventing such an inflow of an underfill include a suggested technique by which, when an imaging element is mounted on a glass wiring board by flip-flop mounting, a ring-shaped sealing structure is provided on the inner side of the bumps to seal the light receiving portion of the imaging element, and thus, an inflow of an underfill is prevented (see Japanese Patent No. 5397037, for example).

By this technique, the space between the light receiving portion of the imaging element and the glass wiring board is sealed by the sealing structure, and glass through holes are formed at such positions that air can be released from an outer portion of the sealed space in the glass wiring board. As glass through holes are formed in this manner, it becomes possible to prevent inclination and defective mounting of the imaging element due to a rise in the internal pressure of the sealing portion caused by a temperature rise at the time of mounting of the imaging element.

By this technique, however, if the glass through holes are left open, the glass through holes become starting points of glass cracks or the like, resulting in lower reliability.

To counter this, the glass through holes may be filled with resin or the like after the assembling, but the cost will increase accordingly. Further in such a case, it is necessary to fill the glass through holes after an imaging element is mounted, and it is also necessary to form through holes for conduction in the front and back build-up layers separately from through holes as the air passages for releasing internal pressure. Therefore, the manufacturing process becomes very complicated.

Also, due to the hardening shrinkage or the like of resin during the filling of the glass through holes, uneven stress is applied to the glass wiring board in the plane in the thickness direction. As a result, it becomes extremely difficult to control warpage of the entire package, and warpage of the imaging element is caused by warpage of the glass wiring board. In such a case, there is a high possibility of degradation of image quality or the like.

Further, another suggested technique for preventing an inflow of an underfill is a technique for preventing an inflow of the sealing resin into the light receiving portion, or an inflow of the underfill, by providing a bank portion on a glass wiring board and an imaging element in a case where the imaging element is mounted on the glass wiring board by flip-chip mounting (see Japanese Patent Application Laid-Open No. 2003-78121, for example). In this technique, the light receiving portion is sealed by the underfill at the time of the mounting of the imaging element, but the bank portion is formed so that the underfill does not flow into the light receiving portion at that time.

In this technique, however, the bank portion needs to be additionally formed by resin printing. Therefore, the number of steps increases, and the manufacturing cost rises. Also, the bank portion is formed only on one surface side of the glass wiring board and the imaging element. Therefore, due to shrinkage of the resin caused by temperature at the bank portion or the like, uneven stress is applied to both the glass wiring board and the imaging element in the plane in the thickness direction, and causes warpage of both components. In such a case, there is a high possibility of degradation of image quality or the like.

To counter this in the present technology, the opening 90 is provided by forming a groove in the wiring layer 62 so as to surround the light receiving portion of the imaging element 52, the pads 92 and the like are provided in the opening 90, and the imaging element 52 is mounted by bump connection so that an inflow of the underfill into the light receiving portion is prevented.

In a case where sealing is performed with an underfill as shown in the example in FIG. 2, the underfill is applied to the portions of the bumps 94 and the bumps 95.

Here, the opening 90 is provided so that the bump portions connecting to the imaging element 52 are turned into a dam structure as described above. In this manner, the underfill as the sealing resin can be prevented from flowing to the light receiving portion side of the imaging element 52 beyond the opening 90. That is, the underfill applied to the bumps 94 and the like in the opening 90 can be prevented from flow into the light receiving portion of the imaging element 52 by the protruding portion 91, which is the portion of the insulating layer formed on the light receiving portion side of the opening 90.

Such a dam structure can be collectively formed in the layer stacking step in which the insulating layers and the conductive layers constituting the build-up wiring layer 62 are formed. Thus, according to the present technology, the dam structure for the underfill as the sealing resin can be formed at low cost.

Moreover, in the present technology, there is no need to form a dedicated bank portion for damming the underfill in the glass wiring board 51 or the imaging element 52, and thus, uneven stress is not applied to the glass wiring board 51 and the imaging element 52. Accordingly, warpage does not occur in the glass wiring board 51 and the imaging element 52, and degradation of image quality does not occur.

It should be noted that an example in which a dam structure including the opening 90 and the protruding portion 91 is formed only in the wiring layer 62 of the core substrate 61 on the side of the imaging element 52 has been described. However, a similar dam structure may also be formed on the side of the wiring layer 63 of the core substrate 61. In that case, the position of the dam structure on the side of the wiring layer 62 and the position of the dam structure on the side of the wiring layer 63 are located at the same position in the lateral direction in FIG. 2, or the dam structures are formed in symmetrical positions on the front and back of the core substrate 61. In this manner, the film stress in the thickness direction in the plane of the glass wiring board 51 can be made uniform. With this arrangement, warpage of the glass wiring board 51 and the imaging element 52 can be further prevented.

<Example Structure of an Imaging Device>

Next, a specific embodiment to which the present technology is applied is described.

Figure 3:
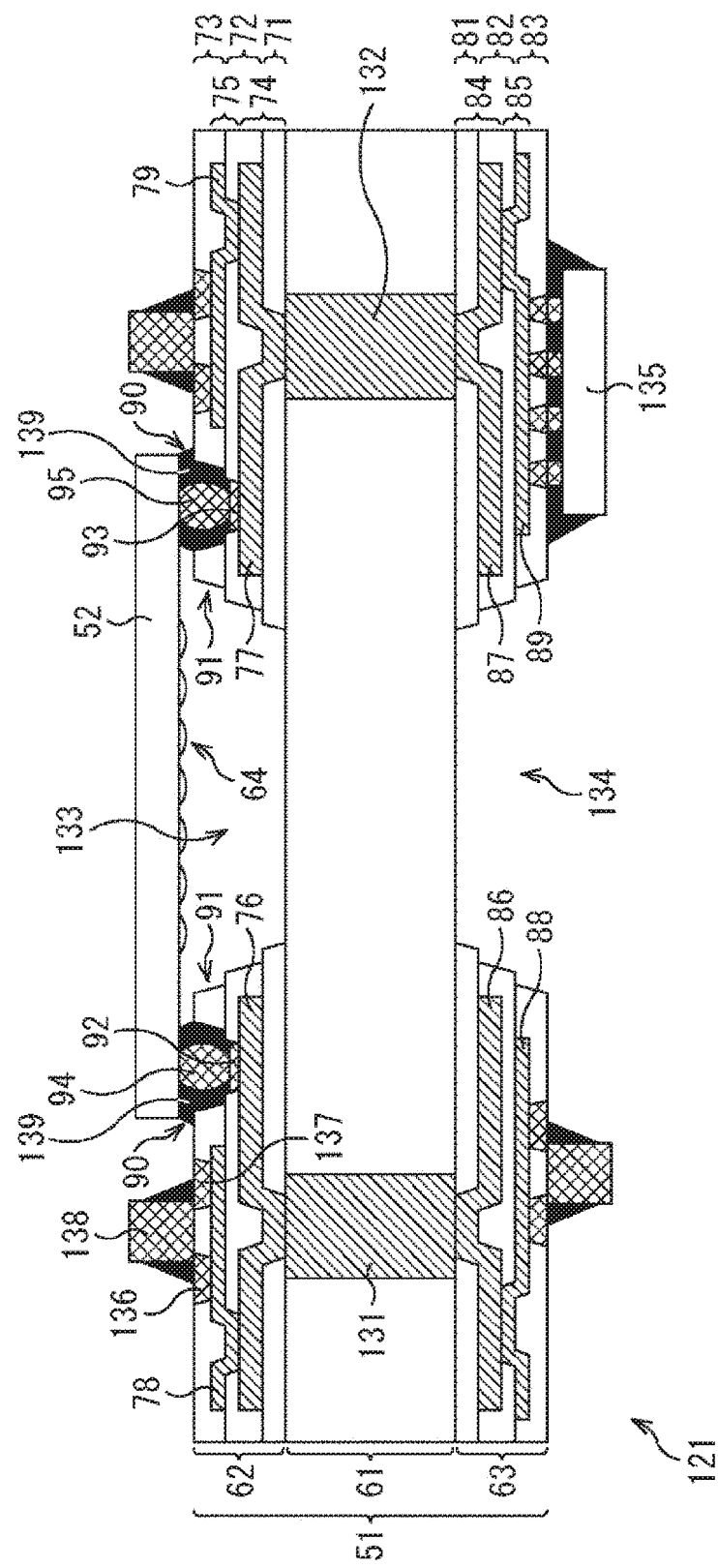
FIG. 3 is a diagram showing an example structure of an imaging device to which the present technology is applied.

FIG. 3 is a diagram showing an example structure of an embodiment of an imaging device to which the present technology is applied. It should be noted that, in FIG. 3, the components equivalent to those shown in FIG. 2 are denoted by the same reference numerals as those used in FIG. 2, and explanation of them will not be unnecessarily repeated.

The imaging device 121 shown in FIG. 3 includes a glass wiring board 51 and an imaging element 52 mounted on the glass wiring board 51. In FIG. 3, a cross section of the imaging device 121 is shown.

In the imaging element 52 in this example, microlenses 64 are also provided on the light receiving portion that receives light from the outside, and the imaging element 52 is secured onto the glass wiring board 51 by bump connection, with the surface having the microlenses 64 thereon or the light receiving portion facing the glass wiring board 51.

The glass wiring board 51 also includes a core substrate 61, a wiring layer 62 and a wiring layer 63 that are stacked on the core substrate 61. Further, as in the case shown in FIG. 2, layers from an insulating layer 71 to a conductive layer 75 are formed in the wiring layer 62, and layers from an insulating layer 81 to a conductive layer 85 are formed in the wiring layer 63.

The core substrate 61 is made by including glass, for example, and a through electrode 131 and a through electrode 132 that penetrate through the core substrate 61, and electrically connect the conductive layer 74 formed on one side to the conductive layer 84 formed on the other side are provided in the core substrate 61.

For example, a metal wiring line 76 forming the conductive layer 74 is connected to one end of the through electrode 131, and a metal wiring line 86 forming the conductive layer 84 is connected to the other end of the through electrode 131. In this manner, the front and back surfaces of the core substrate 61 are electrically connected to each other by the through electrode 131 and the through electrode 132.

In addition, although an example case where the core substrate 61 includes glass is described herein, the core substrate 61 does not necessarily include glass but may be made by including a transparent material having some degree of rigidity and light transmission properties.

Further, in the portions of the wiring layer 62 and the wiring layer 63 facing the light receiving portion of the imaging element 52, an opening 133 and an opening 134 are formed, so that the core substrate 61 is exposed. Through the opening 133 and the opening 134, the imaging element 52 can receive light from the outside (the object).

That is, the opening 134 functions as a light passing opening for guiding light entering from the outside to the core substrate 61. The opening 133 also functions as a light passing opening that guides light that has entered from the outside and passed through opening 134 and the light-transmissive core substrate 61, to the light receiving portion of the imaging element 52.

Accordingly, light that has entered the opening 134 from the outside passes through the core substrate 61 and the opening 133, and then enters the light receiving portion of the imaging element 52. At this stage, the microlenses 64 collect the incident light, and cause the incident light to enter each pixel formed in the light receiving portion of the imaging element 52. Each pixel then photoelectrically converts the incident light, and thus, an image is captured.

Meanwhile, various components are connected to the second conductive layer 85, which is the outermost conductive layer of the wiring layer 63. For example, a predetermined component 135 is connected to a metal wiring line 89 forming the conductive layer 85 via pads.

Likewise, various components are also connected to the second conductive layer 75, which is the outermost conductive layer of the wiring layer 62. For example, a predetermined component 138 is connected to a metal wiring line 78 forming the conductive layer 75 via pads 136 and pads 137.

An opening 90 having a dam structure is also formed in the wiring layer 62, and the imaging element 52 is bump-connected to the conductive layer 74 inside the opening 90 by bumps 94 and bumps 95. Here, pads for mounting the imaging element 52 by bump connection, such as the pads 92 and the pads 93, are all formed on the same conductive layer 74.

As the imaging element 52 is mounted on the first conductive layer 74 located closer to the core substrate 61 than the outermost conductive layer as described above, mounting of the imaging element 52 can be performed with high flatness and at low cost.

Further, in this example, an underfill 139 that is a sealing resin is applied to the portions of the bumps 94 and the bumps 95, and the portion of the opening 133 is sealed with the underfill 139. In this example, the sealed portion of the opening 133 is filled with air.

The bump connecting portions such as the bumps 94 and the pads 92 between the imaging element 52 and the pads 92 and the like on the side of the glass wiring board 51 are also covered with the underfill 139, and the underfill 139 also functions as a protective resin that protects the bump connecting portions.

In the imaging device 121, even in a case where the opening 133 is sealed with the underfill 139 in this manner, an inflow of the underfill 139 into the light receiving portion is prevented by the opening 90 in the form of a groove having a dam structure and the protruding portion 91 that is located adjacent to the light receiving portion side of the imaging element 52 with respect to the opening 90 and protrudes upward in the drawing.

Figure 4:
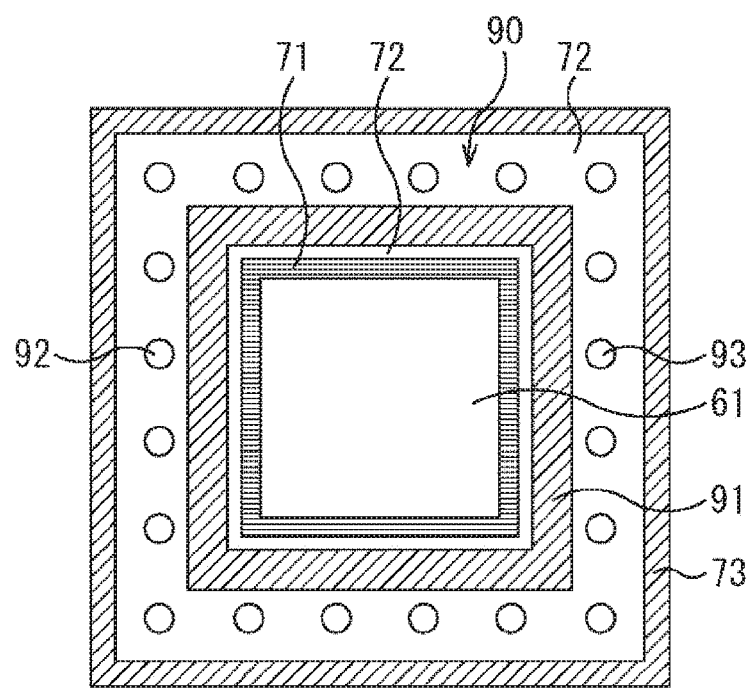
FIG. 4 is a diagram showing an example structure of an opening.

The opening 90 and the protruding portion 91 of the dam structure are as shown in FIG. 4, for example, when viewed from a direction perpendicular to the glass wiring board 51 and the imaging element 52. It should be noted that, in FIG. 4, the components equivalent to those shown in FIG. 3 are denoted by the same reference numerals as those used in FIG. 3, and explanation of them will not be unnecessarily repeated.

In the example shown in FIG. 4, a rectangular groove is formed as the opening 90 so as to surround the portion to be sealed in the space between the light receiving portion of the imaging element 52 and the core substrate 61. The bottom surface of the opening 90 is the second insulating layer 72, and the pads 92 and the pads 93 formed on the surface of the conductive layer 74 buried in the insulating layer 72 are provided in the portion of the insulating layer 72.

Also, the outer side and the inner side of the opening 90 are the insulating layer 73, which is located on the front side of the insulating layer 72 in the drawing, or is higher on the side of the imaging element 52. Particularly, in FIG. 4, the portion of the insulating layer 73 adjacent to the inner side of the opening 90 is the above described protruding portion 91, and the underfill 139 is dammed by the protruding portion 91 and is prevented from flowing into the light receiving portion of the imaging element 52.

As the opening 90 having such a dam structure can be formed easily and inexpensively without an increase in the number of manufacturing steps, an inflow of the underfill can be prevented at low cost by the opening 90.

<Description of a Manufacturing Process>

Referring now to the flowchart shown in FIG. 5 and FIGS. 6 through 9, a manufacturing process that is the process of manufacturing an imaging device according to the present technology is described. It should be noted that, in FIGS. 6 through 9, components corresponding to each other are denoted by like reference numerals, and the components equivalent to those shown in FIG. 3 are denoted by the same reference numerals as those used in FIG. 3. Therefore, explanation of them will not be unnecessarily repeated. Further, in FIGS. 6 through 9, some of the components corresponding to each other are not denoted with any reference numerals, for easier viewing of the drawings.

Figure 5:
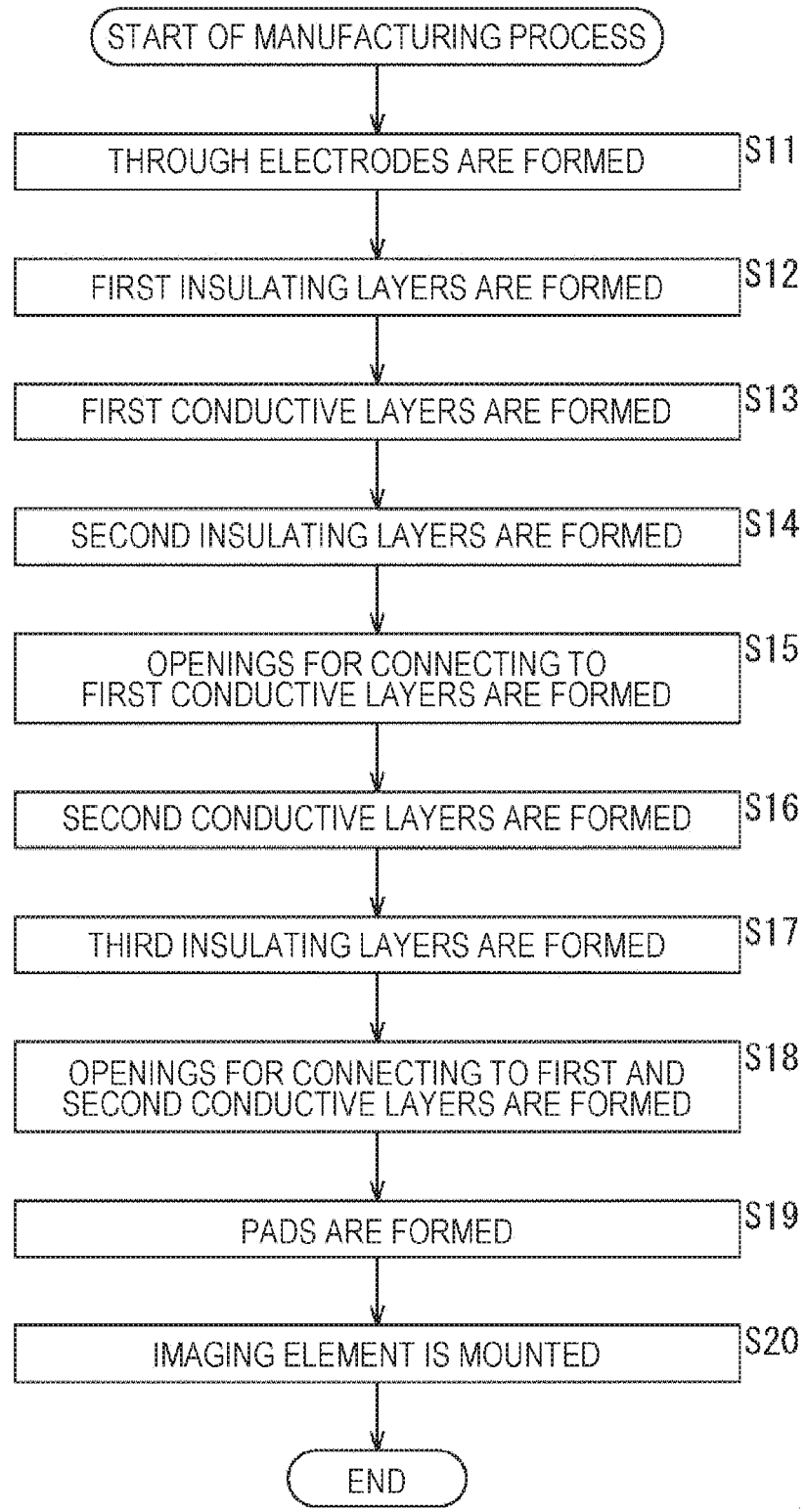
FIG. 5 is a flowchart for explaining a manufacturing process.

The manufacturing process to be described with reference to FIG. 5 is an example in which an exposure and developing via is formed so that the opening equivalent to the opening 90 is formed.

In step S11, through electrodes are formed in a light-transmissive core substrate.

Figure 6:
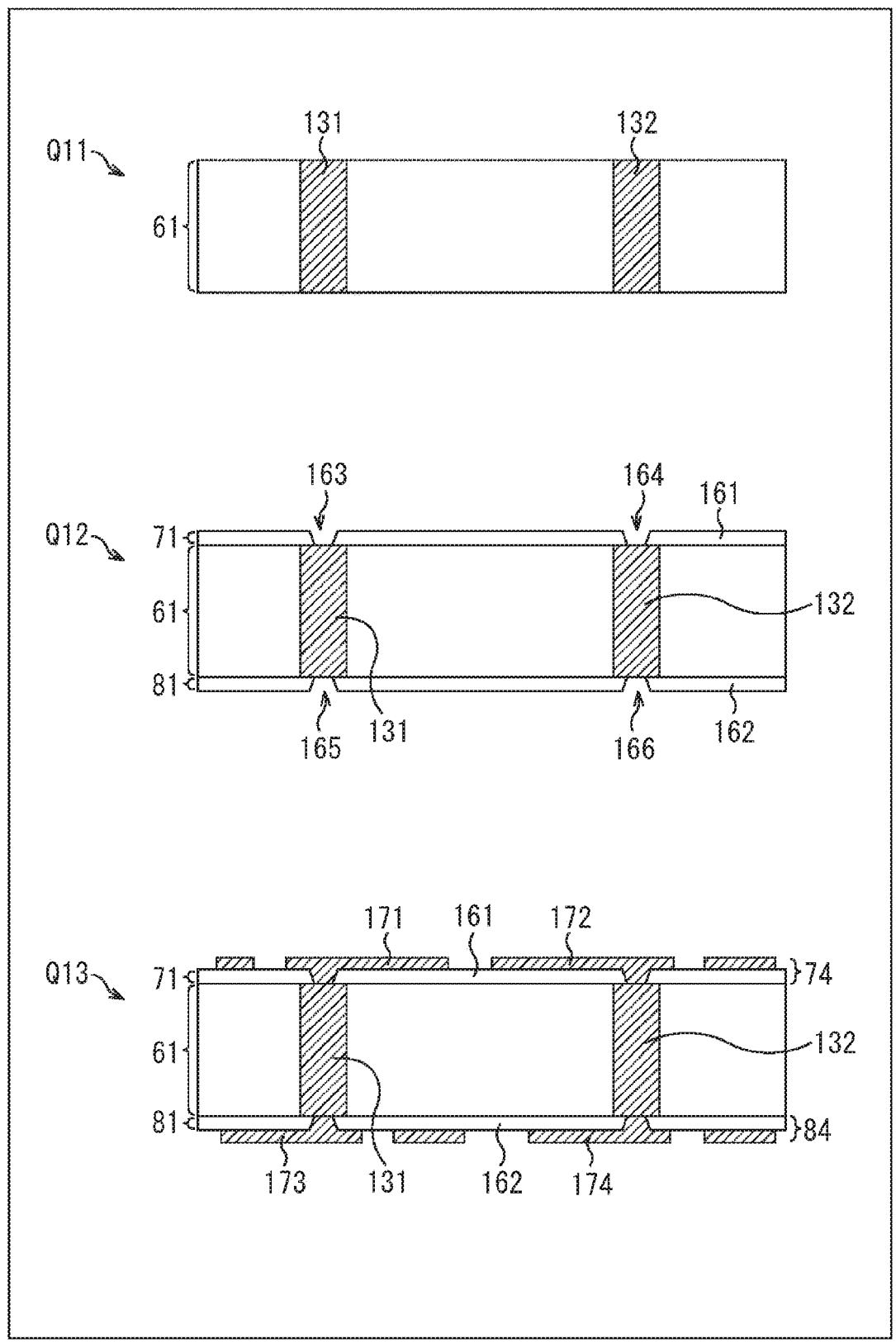
FIG. 6 is a diagram for explaining the manufacture of an imaging device.

Specifically, as indicated by an arrow Q11 in FIG. 6, for example, the through electrode 131 and the through electrode 132 penetrating through the core substrate 61 are formed on the core substrate 61 including glass. Here, the through electrode 131 and the through electrode 132 are formed with a material such as copper (Cu) or a conductive paste, for example.

In step S12, the first insulating layer is formed on both surfaces of the core substrate.

As indicated by an arrow Q12 in FIG. 6, for example, an insulating layer film 161 is formed on one surface of the core substrate 61, and this portion of the insulating layer film 161 is turned into the insulating layer 71. An insulating layer film 162 is formed on the other surface of the core substrate 61, and this portion of the insulating layer film 162 is turned into the insulating layer 81.

Here, the insulating layer film 161 and the insulating layer film 162 include a resin such as polyimide or polybenzoxazole, or are formed with inorganic films such as $SiO_2$ films or SiN films, for example. Particularly, the insulating layer 71 and the insulating layer 81 function as layers that reduce the stress to be generated between the core substrate 61, and the metal wiring layers and the bumps and the like, as described above.

Further, in step S12, after the insulating layers are formed, openings for connecting to the through electrode 131 and the through electrode 132 are formed by exposure and development or the like on the insulating layer film 161 and the insulating layer film 162.

In this example, an opening 163 for connecting to the through electrode 131 and an opening 164 for connecting to the through electrode 132 are formed in the insulating layer film 161. Likewise, an opening 165 for connecting to the through electrode 131 and an opening 166 for connecting to the through electrode 132 are formed in the insulating layer film 162.

It should be noted that, since the core substrate 61 includes glass in this example, processing for forming the first insulating layer is performed. However, in a case where the core substrate 61 includes resin or the like, there is no need to form the first insulating layer on the surface of the core substrate 61. Therefore, in a case where the core substrate 61 includes resin or the like, the process in step S12 may not be performed.

In step S13, a wiring pattern of a metal film is formed on the surface of the first insulating layer by a semi-additive method or the like, so that the first conductive layer is formed.

As indicated by an arrow Q13 in FIG. 6, for example, a metal wiring line 171, a metal wiring line 172, and the like are formed with Cu or the like on the surface of the insulating layer 71, and the layer constituted by these metal wiring lines is turned into the first conductive layer 74. In this example, the metal wiring line 171 is connected directly to the through electrode 131, and this metal wiring line 171 is equivalent to the metal wiring line 76 shown in FIG. 3.

Likewise, a metal wiring line 173, a metal wiring line 174, and the like are formed with Cu or the like on the surface of the insulating layer 81, and the layer constituted by these metal wiring lines is turned into the first conductive layer 84. In this example, the metal wiring line 173 is connected directly to the through electrode 131, and this metal wiring line 173 is equivalent to the metal wiring line 86 shown in FIG. 3.

In step S14, the second insulating layer is formed on the surface of the first conductive layer by coating, lamination, or the like.

Figure 7:
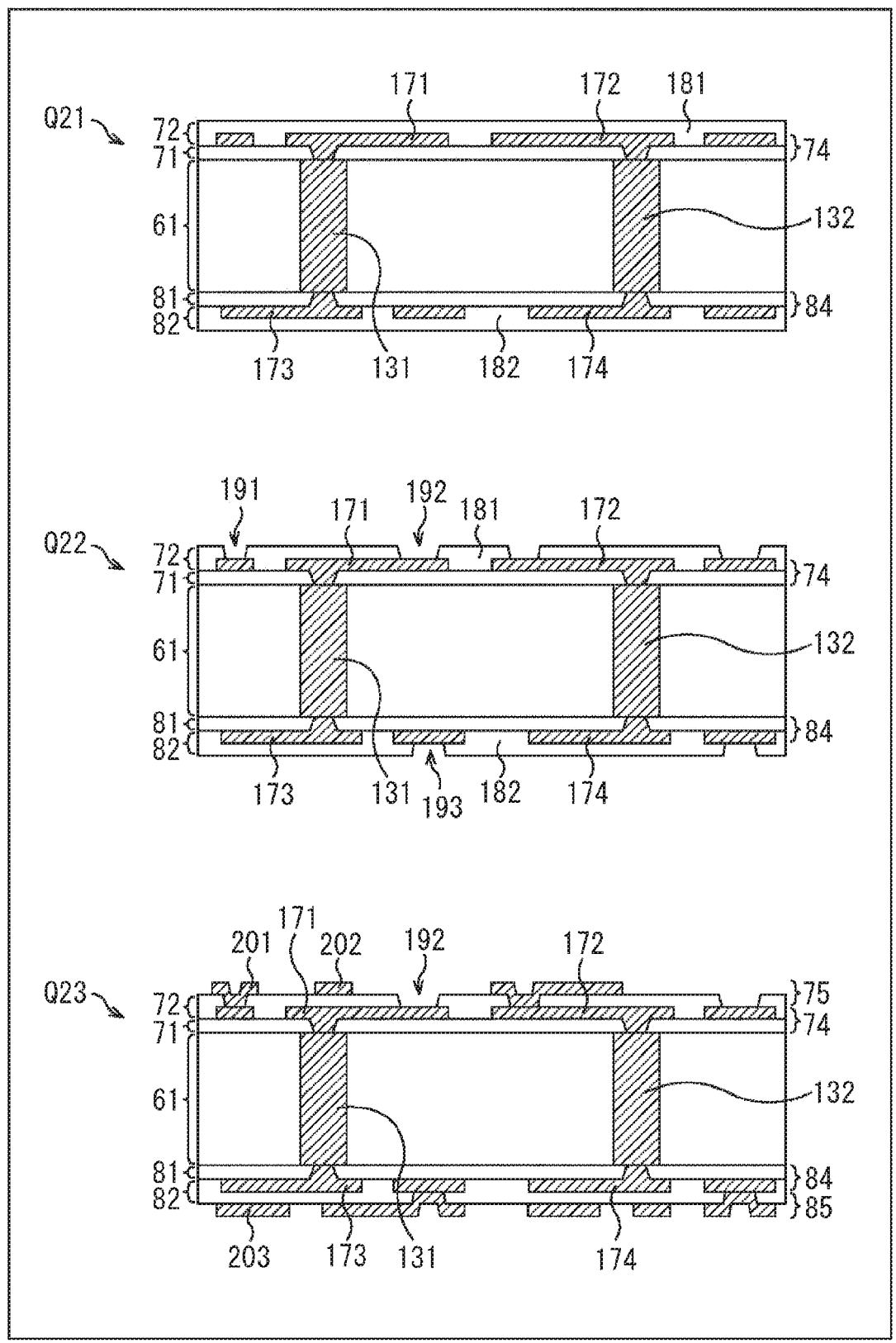
FIG. 7 is a diagram for explaining the manufacture of an imaging device.

As indicated by an arrow Q21 in FIG. 7, for example, an insulating layer film 181 is formed on the surfaces of the insulating layer 71 and the conductive layer 74 formed on one surface of the core substrate 61, and this portion of the insulating layer film 181 is turned into the second insulating layer 72. Likewise, an insulating layer film 182 is formed on the surfaces of the insulating layer 81 and the conductive layer 84, and this portion of the insulating layer film 182 is turned into the second insulating layer 82.

In step S15, an opening for connecting to the first conductive layer is formed by exposure and development or the like on the second insulating layer. At this stage, an opening for forming an opening penetrating through several insulating layers to mount a semiconductor element onto the glass wiring board 51 is also formed.

As indicated by an arrow Q22 in FIG. 7, for example, exposure and development are performed on the insulating layer film 181, so that an opening 191 for connecting to the metal wiring line formed in the first conductive layer 74, an opening 192 for forming an opening penetrating through several insulating layers, and the like are formed. Likewise, exposure and development are also performed on the insulating layer film 182, so that an opening 193 for connecting to the metal wiring line formed in the first conductive layer 84, and the like are also formed.

Here, the opening 192 is for forming the opening equivalent to the opening 90 shown in FIG. 3, for example. Therefore, in this example, a semiconductor element is connected to the metal wiring line 171 formed in the first conductive layer 74 by bump connection or the like.

In step S16, a wiring pattern of a metal film is formed on the surface of the second insulating layer by a semi-additive method or the like, so that the second conductive layer is formed.

As indicated by an arrow Q23 in FIG. 7, for example, a metal wiring line 201, a metal wiring line 202, and the like are formed with Cu or the like on the surface of the insulating layer 72, and the layer constituted by these metal wiring lines is turned into the second conductive layer 75. In this example, the metal wiring line 201 is connected to the metal wiring line provided in the first conductive layer 74 via the opening 191.

Likewise, a metal wiring line 203 and the like are formed with Cu or the like on the surface of the insulating layer 82, and the layer constituted by these metal wiring lines is turned into the second conductive layer 85.

In step S17, the third insulating layer is formed on the surface of the second conductive layer by coating, lamination, or the like.

Figure 8:
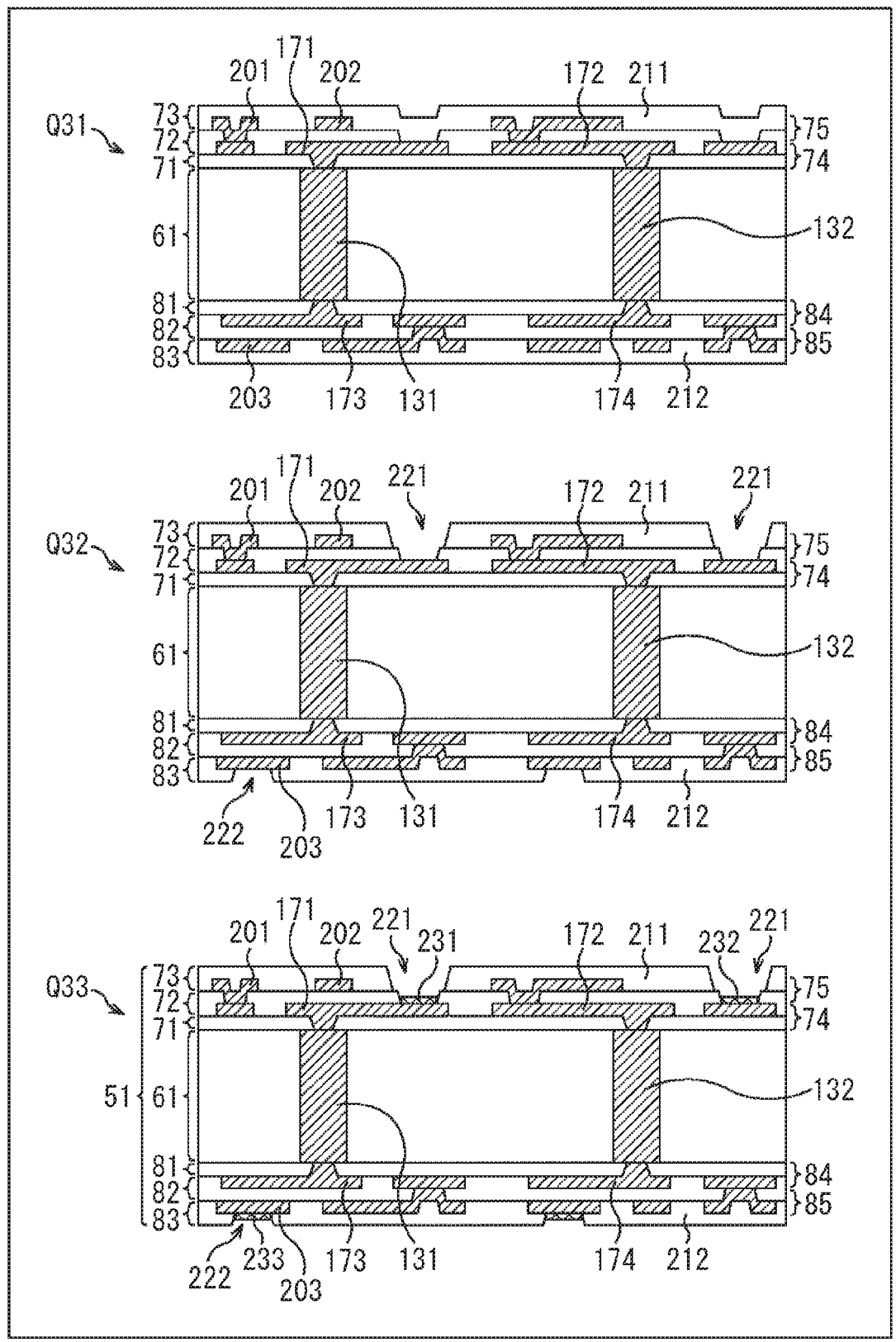
FIG. 8 is a diagram for explaining the manufacture of an imaging device.

As indicated by an arrow Q31 in FIG. 8, for example, an insulating layer film 211 is formed on the surfaces of the insulating layer 72 and the conductive layer 75 formed on one surface of the core substrate 61, and this portion of the insulating layer film 211 is turned into the third insulating layer 73. Likewise, an insulating layer film 212 is formed on the surfaces of the insulating layer 82 and the conductive layer 85, and this portion of the insulating layer film 212 is turned into the third insulating layer 83.

In step S18, an opening for connecting to the first conductive layer, and an opening for connecting to the second conductive layer are simultaneously formed by exposure and development or the like on the third insulating layer.

As indicated by an arrow Q32 in FIG. 8, for example, exposure and development are performed on the insulating layer film 211, so that an opening 221 for connecting to the metal wiring line formed in the first conductive layer 74, and the like are formed. Likewise, exposure and development are also performed on the insulating layer film 212, so that an opening 222 for connecting to the metal wiring line formed in the second conductive layer 85, and the like are also formed.

Here, the opening 221 is the opening equivalent to the opening 90 shown in FIG. 3, for example, and this opening 221 is an opening having a dam structure formed so as to surround the portion of the opening 133 shown in FIG. 3, which is the portion through which the core substrate 61 is exposed for light transmission. That is, like the opening 90 shown in FIG. 4, the opening 221 is formed in a groove-like shape so as to surround the portion on which the imaging element 52 is to be mounted.

In the insulating layer 83, the opening 222 for connecting to the metal wiring line 203 provided in the second conductive layer 85, and the like are also formed.

It should be noted that, although an opening for connecting to the metal wiring line in the second conductive layer 75 is not formed in the insulating layer film 211 in this example, such an opening may be formed.

In step S19, for example, pads for mounting components such as a semiconductor element are formed by electrolytic plating, electroless plating, or the like.

As indicated by an arrow Q33 in FIG. 8, for example, pads such as pads 231 and pads 232 are formed on the surface of the metal wiring line in the first conductive layer 74 inside the opening 221. Pads such as pads 233 are also formed on the surface of the metal wiring line in the second conductive layer 85.

In this example, the pads 231 are formed on the surface of the metal wiring line 171 inside the opening 221, for example, and the pads 231 are equivalent to the pads 92 shown in FIG. 3.

Also, the pads 233 are formed on the surface of the metal wiring line 203 in the second conductive layer 85 inside the opening 222, and a component such as the component 135 shown in FIG. 3 is mounted on the pads 233, for example.

The respective pads such as the pads 231 to the pads 233 are formed with plating materials such as nickel (Ni) and gold (Au), for example. Specifically, after plating with Ni is performed, for example, plating with Au is further performed on the same portion, so that pads are formed by plating stacking. As the pads 231 and the like are formed in this manner, the glass wiring board 51 is obtained.

In step S20, a component such as an imaging element is mounted on the glass wiring board obtained by the processes in steps S11 through S19, so that an imaging device is formed.

Figure 9:
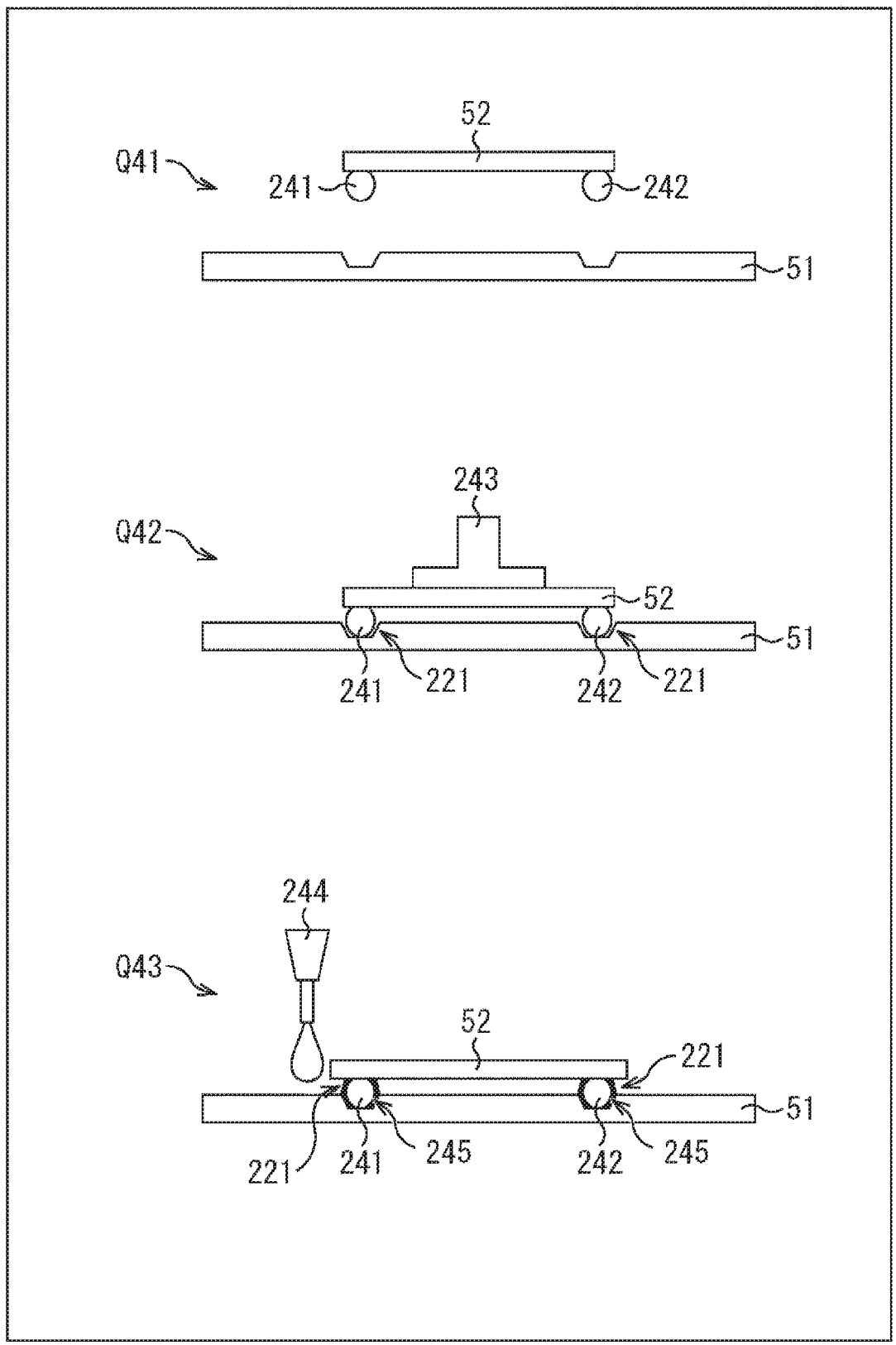
FIG. 9 is a diagram for explaining the manufacture of an imaging device.

As indicated by an arrow Q41 in FIG. 9, for example, bumps 241 and bumps 242 are formed on the imaging element 52 to be mounted. It should be noted that, in FIG. 9, the imaging element 52 and the glass wiring board 51 are drawn in a simplified manner for easier viewing of the drawing.

For example, the bumps 241 and the bumps 242 are metal stud bumps, plating bumps, or the like. Alternatively, the bumps 241 and the bumps 242 may be a land grid array obtained by stacking plating Ni and Au in order, or the like.

After the bumps are formed on the imaging element 52, the imaging element 52 is flip-chip mounted on the glass wiring board 51 by thermal compression bonding or the like with a mounting head 243, as indicated by an arrow Q42.

In this example, the bumps 241 and the bumps 242 are physically and electrically connected (bump-connected) to the pads 231 and the pads 232 (not shown) formed inside the opening 221 of the glass wiring board 51.

An underfill 245 that is a bump protecting resin is then applied to the portions of the bumps 241 and the bumps 242 inside the opening 221 with a resin coating head 244 as indicated by an arrow Q43. After that, the underfill 245 is thermally hardened. This underfill 245 is equivalent to the underfill 139 shown in FIG. 3.

At this stage, the underfill 245 is applied to the portion of the opening 221, which is a groove having a dam structure formed on the glass wiring board 51, so that the underfill 245 is dammed by the portion between the opening 221 in the insulating layer film 211 and the insulating layer film 181, and the light receiving portion of the imaging element 52. Thus, the underfill 245 can be prevented from flowing into the light receiving portion of the imaging element 52.

Components are also mounted on the pads 233 and the like shown in FIG. 8 by bump connection or the like, and an imaging device is completed. The manufacturing process then comes to an end. The imaging device thus obtained is equivalent to the imaging device 121 described above.

In the above manner, at the time of manufacturing am imaging device, the opening 221 having a dam structure is formed in the glass wiring board 51, the pad provided in the opening 221 is bump-connected to the imaging element 52, and the underfill 245 is applied to the connecting portions. Thus, the dam structure for the underfill 245 can be formed at low cost.

Also, as the imaging element 52 is mounted on the conductive layer located on the inner side of the outermost surface of the glass wiring board 51, the imaging element 52 can be mounted with higher flatness and at lower cost.

Because of the above, with an imaging device to which the present technology is applied, component mounting with high flatness can be realized at low cost.

<Description of a Conductive Layer Formation Process>

Figure 10:
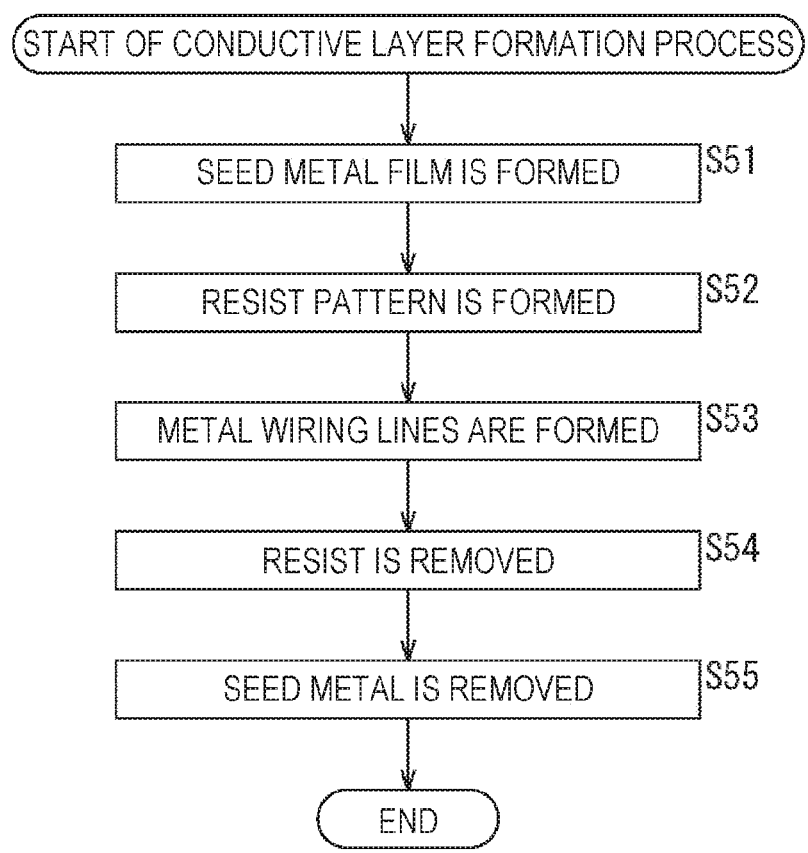
FIG. 10 is a flowchart for explaining a conductive layer formation process.
Figure 12:
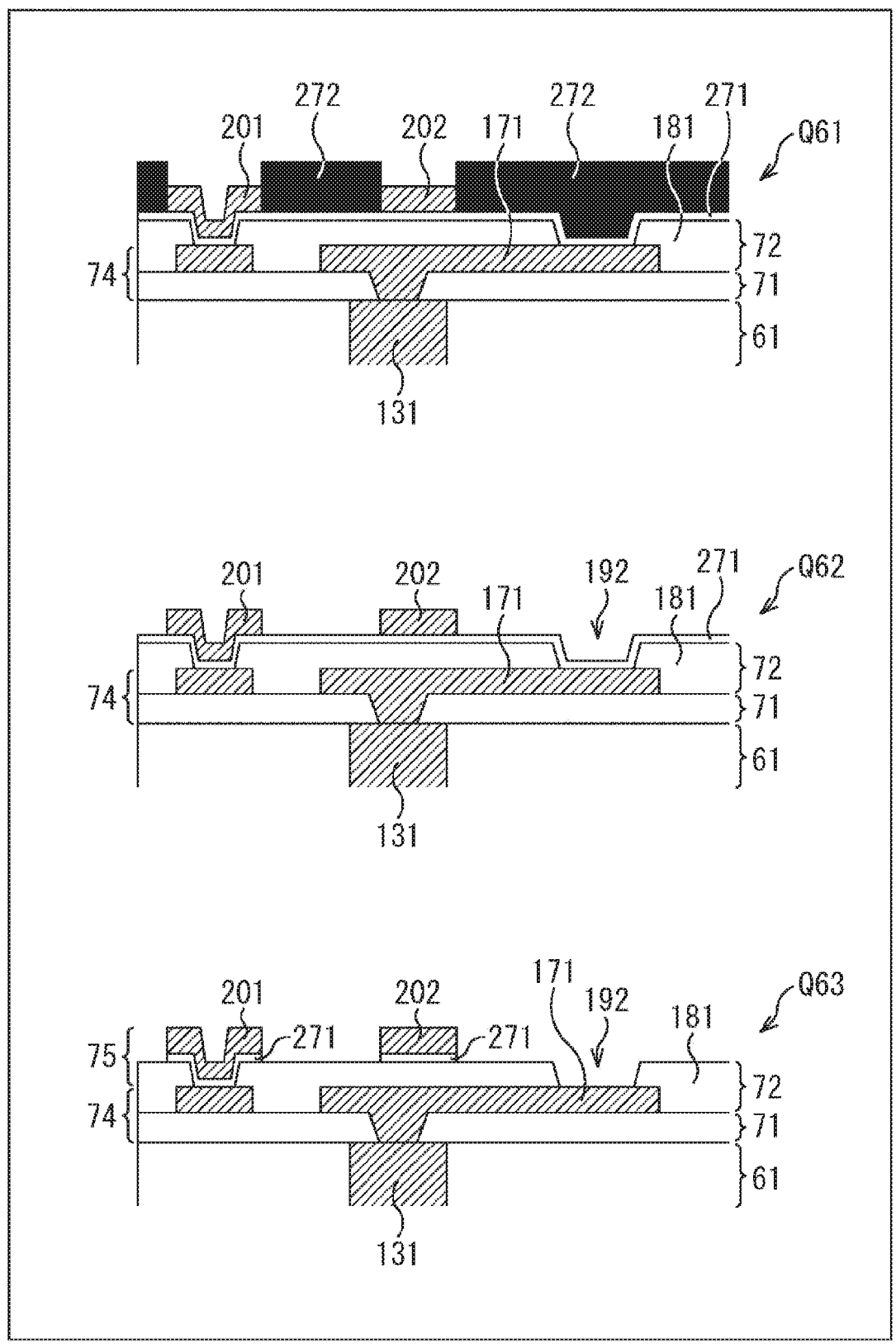
FIG. 12 is a diagram for explaining the formation of a conductive layer.

Referring now to the flowchart shown in FIG. 10 and FIGS. 11 and 12, the process in step S16 in the manufacturing process shown in FIG. 5 is described in greater detail. That is, referring now to the flowchart in FIG. 10, the conductive layer formation process corresponding to the process in step S16 in FIG. 5 is described.

It should be noted that, although the process of forming the second conductive layer by a semi-additive method is described herein, a process similar to the process to be described with reference to FIG. 10 is also performed in a case where the first conductive layer is formed by a semi-additive method in step S13, to be more specific. Also, in FIGS. 11 and 12, the components equivalent to those shown in FIG. 7 are denoted by the same reference numerals as those used in FIG. 7, and explanation of them will not be unnecessarily repeated.

In the conductive layer formation process shown in FIG. 10, a seed metal is formed on the second insulating layer in step S51.

That is, as indicated by an arrow Q51 in FIG. 11, for example, a seed metal 271 is formed on the second insulating layer 72 adjacent to the first conductive layer 74 to which the imaging element 52 is to be connected. Specifically, for example, the seed metal 271 is formed on the surface of the insulating layer film 181 forming the insulating layer 72 by sputtering or the like. It should be noted that FIG. 11 is an enlarged view of a portion of the glass wiring board 51 located in the vicinity of the metal wiring line 171 in FIG. 7.

For example, the seed metal 271 is formed by sequentially stacking titanium (Ti) and Cu on the surface of the insulating layer film 181 by sputtering. More specifically, after a Ti film is formed on the surface of the insulating layer film 181, for example, a Cu film is further formed thereon, and the Ti and Cu films are turned into the seed metal 271. The seed metal 271 formed in this manner serves as the foundation layer for plating.

In step S52, a resist pattern is formed on the seed metal surface by exposure and development.

As indicated by an arrow Q52 in FIG. 11, for example, a resist 272 is applied onto a desired region on the seed metal 271 including the portion of the opening 192, so that a resist pattern is formed. Of the resist pattern, the portions to be subjected to plating in a later process are in an opened state, or do not have the resist 272 therein.

In this example, the seed metal 271 and the resist 272 are also formed on (applied to) the portion of the opening 192 formed (opened) for forming the opening 221 so that the imaging element 52 is mounted in a later stage.

In step S53, the metal wiring lines forming the second conductive layer 75 are formed in the opening portion of the resist pattern by plating.

As indicated by an arrow Q61 in FIG. 12, for example, the metal wiring line 201 and the metal wiring line 202 are formed in the opening portion of the resist pattern by Cu plating.

In step S54, the resist pattern, or the resist on the seed metal, is removed with a resist cleaning liquid. For example, the resist 272 is removed as indicated by an arrow Q62 in FIG. 12.

In step S55, the seed metal is removed by wet etching, the second conductive layer is formed, and the conductive layer formation process comes to an end.

For example, the seed metal 271 is removed as indicated by an arrow Q63 in FIG. 12, and the state as indicated by the arrow Q23 in FIG. 7 is achieved. It should be noted that, in the example indicated by the arrow Q23 in FIG. 7, the seed metal 271 is not shown, and the diagram indicated by the arrow Q63 in FIG. 12 is a more specific diagram of the diagram indicated by the arrow Q23 in FIG. 7.

In the example indicated by the arrow Q63 in FIG. 12, only the portion between the metal wiring lines 201 and 202 and the insulating layer film 181 in the seed metal 271 is left, and the other portions of the seed metal 271 formed on the insulating layer 72, such as the portion of the opening 192, are completely removed. Therefore, at the portion of the opening 192, part of the metal wiring line 171 forming the first conductive layer 74 is exposed.

As the seed metal 271 is removed in this manner, the second conductive layer 75 adjacent to the first conductive layer 74 is formed.

In this example, when the seed metal 271 is removed, the portion of the seed metal 271 located inside the opening 192 can also be selectively removed with the use of a Ti removing solution that hardly damages Cu. As a Ti removing solution having a selective ratio with respect to Cu is used, it is possible to remove the seed metal 271 while hardly damaging the first conductive layer 74 such as the exposed metal wiring line 171 of Cu. That is, it is possible to perform processing that hardly damages the necessary metal wiring lines. Thus, the opening 192 can be formed in the portion where the opening 221 for mounting the imaging element 52 is to be formed.

In the above manner, the metal wiring lines are formed by a semi-additive method at the time of the formation of the second conductive layer.

<Example of a Pad Structure>

Figure 13:
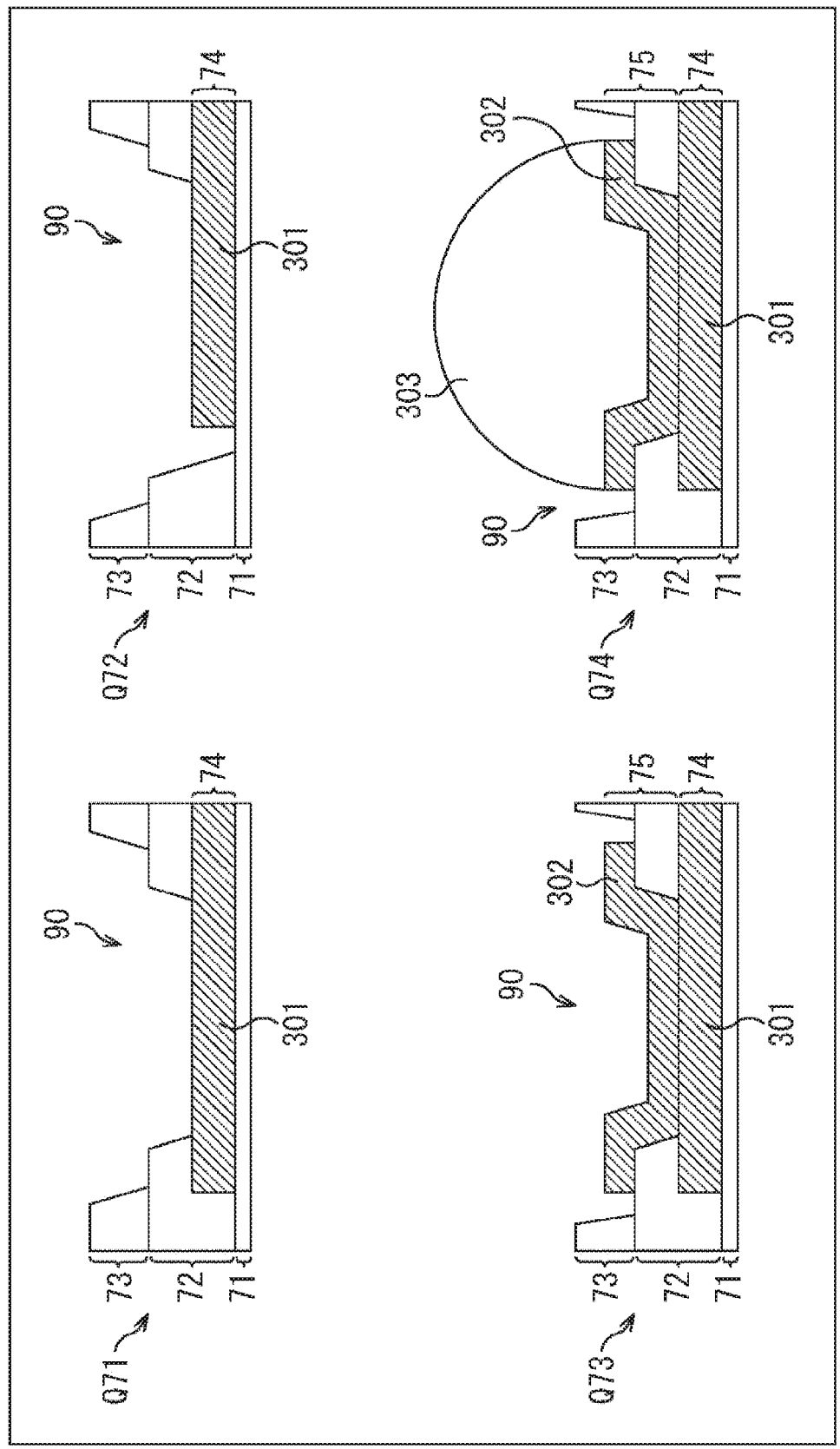
FIG. 13 is a diagram showing examples of pad structures.

Meanwhile, the respective pads such as the pads 92 and the pads 93 shown in FIG. 3, or the pad structure for mounting the imaging element 52 that is a semiconductor element as a mounted component onto the glass wiring board 51 may have any structure, and can have the structure shown in FIG. 13, for example. It should be noted that, in FIG. 13, the components equivalent to those shown in FIG. 3 are denoted by the same reference numerals as those used in FIG. 3, and explanation of them will not be unnecessarily repeated.

In an example indicated by an arrow Q71, the portion of a metal wiring line 301 formed in the conductive layer 74 exposed through the opening 90 is a land forming a pad (a pad structure) for mounting the imaging element 52.

Also, in an example indicated by an arrow Q72, the portion of a metal wiring line 301 exposed through the opening 90 is a land as in the example indicated by the arrow Q71. In this example, however, the end portion of the metal wiring line 301 is located inside the opening 90.

Further, in an example indicated by an arrow Q73, a metal wiring line 302 forming the second conductive layer 75 is formed on the surface of the land portion of a metal wiring line 301 similar to that of the example indicated by the arrow Q71, and this metal wiring line 302 also functions as a land. That is, in this example, pads are formed with a two-layer land including the land portion of the metal wiring line 301 and the metal wiring line 302 as a land.

It should be noted that the metal wiring line 302 may be a metal wiring line forming the conductive layer 75 as long as the metal wiring line 302 is provided over the conductive layer 74, or more specifically, over the metal wiring line 301 forming the conductive layer 74. Alternatively, the metal wiring line 302 may be a land (a pad) formed on the surface of the metal wiring line 301 after the opening 90 is formed.

Further, in the pad structure indicated by the arrow Q73, a bump 303 may be further formed on the metal wiring line 302 as indicated by an arrow Q74, and the imaging element 52 may be bump-connected with the bump 303. For example, the bump 303 may be formed with a solder such as lead (Pb)-free SnAgCu, SnAg, or the like.

It should be noted that, in the formation of the bump 303, a Cu core solder may be used for adjusting the gap between the imaging element 52 and the glass wiring board 51. A stud bump including Au or Cu may also be used as the bump 303. In such a case, the surface of the metal wiring line 302 functioning as a land may be Au, a solder, or the like.

Further, in the examples indicated by the arrows Q71 through Q74, the metal wiring line 301 and the metal wiring line 302 may be made only of Cu subjected to Organic Solderability Preservative (OSP) treatment, for example. Alternatively, the metal wiring line 301 and the metal wiring line 302 may be formed by stacking metals in order, such as stacking Cu, Ni, and Au, stacking Cu, Ni, Pd (palladium), and Au, stacking Cu and Ag (silver), or stacking Cu and Sn (tin).

Figure 14:
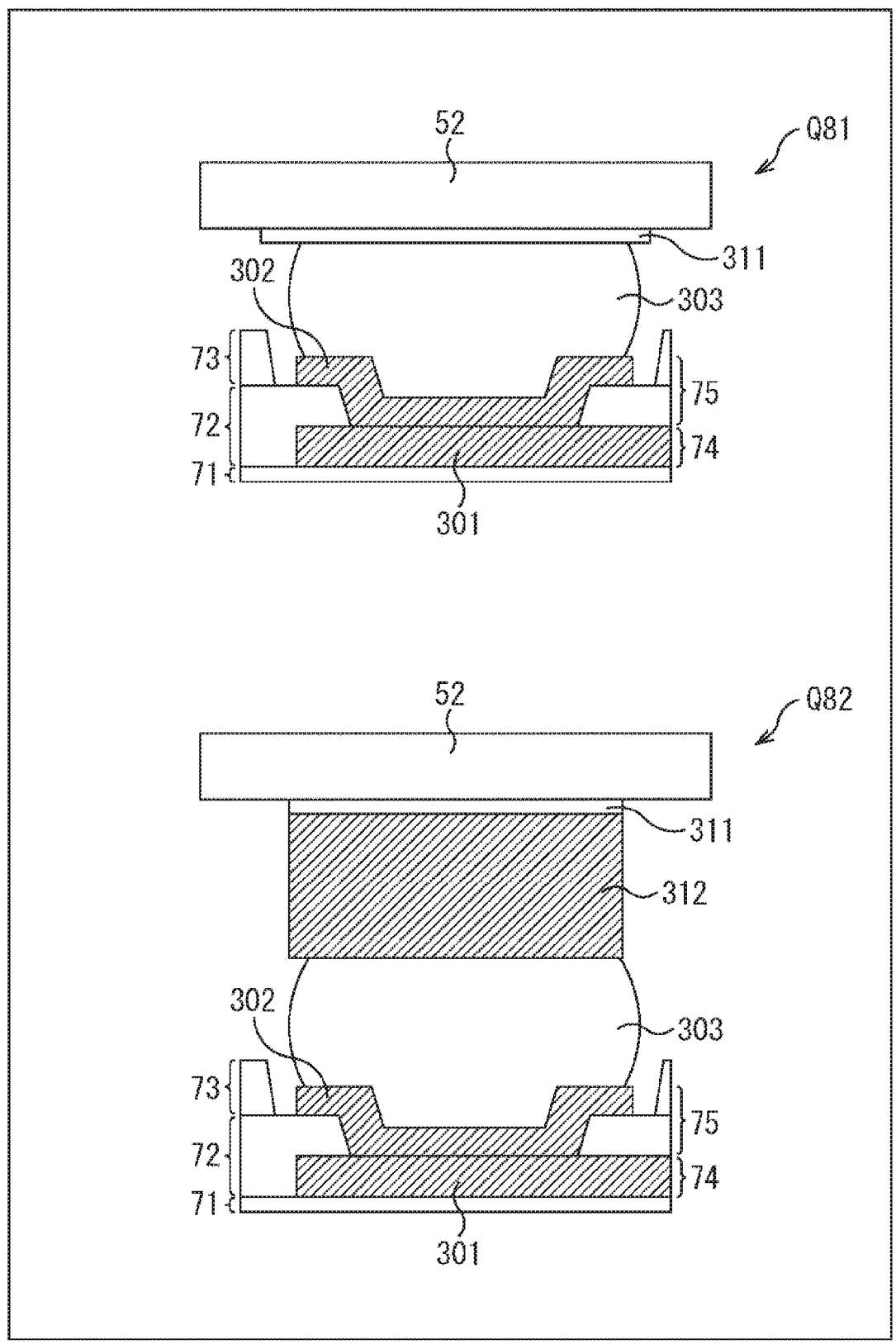
FIG. 14 is a diagram showing examples of pad structures.

Also, in the case of the pad structure indicated by the arrow Q74, for example, when the imaging element 52 is bump-connected to the glass wiring board 51, each connecting portion is as indicated by an arrow Q81 in FIG. 14, for example. It should be noted that, in FIG. 14, the components equivalent to those shown in FIG. 13 are denoted by the same reference numerals as those used in FIG. 13, and explanation of them will not be unnecessarily repeated.

In the example indicated by the arrow Q81, the metal wiring line 302 on the side of the glass wiring board 51 and a land 311 formed on the imaging element 52 are connected with the bump 303, so that the imaging element 52 is mounted on the glass wiring board 51.

Alternatively, as indicated by an arrow Q82, a Cu pillar bump 312 may be further formed on the land 311 on the side of the imaging element 52, and the Cu pillar bump 312 and the bump 303 may be connected so that the imaging element 52 is mounted on the glass wiring board 51.

First Modification of the First Embodiment

<Manufacturing Process>

It should be noted that, in the manufacturing process for manufacturing an imaging device, the opening penetrating through insulating layers to mount the imaging element 52 may not be formed by exposure and development or the like as in the example described above with reference to FIG. 5. Instead, a penetrating opening may be formed by laser opening.

Figure 15:
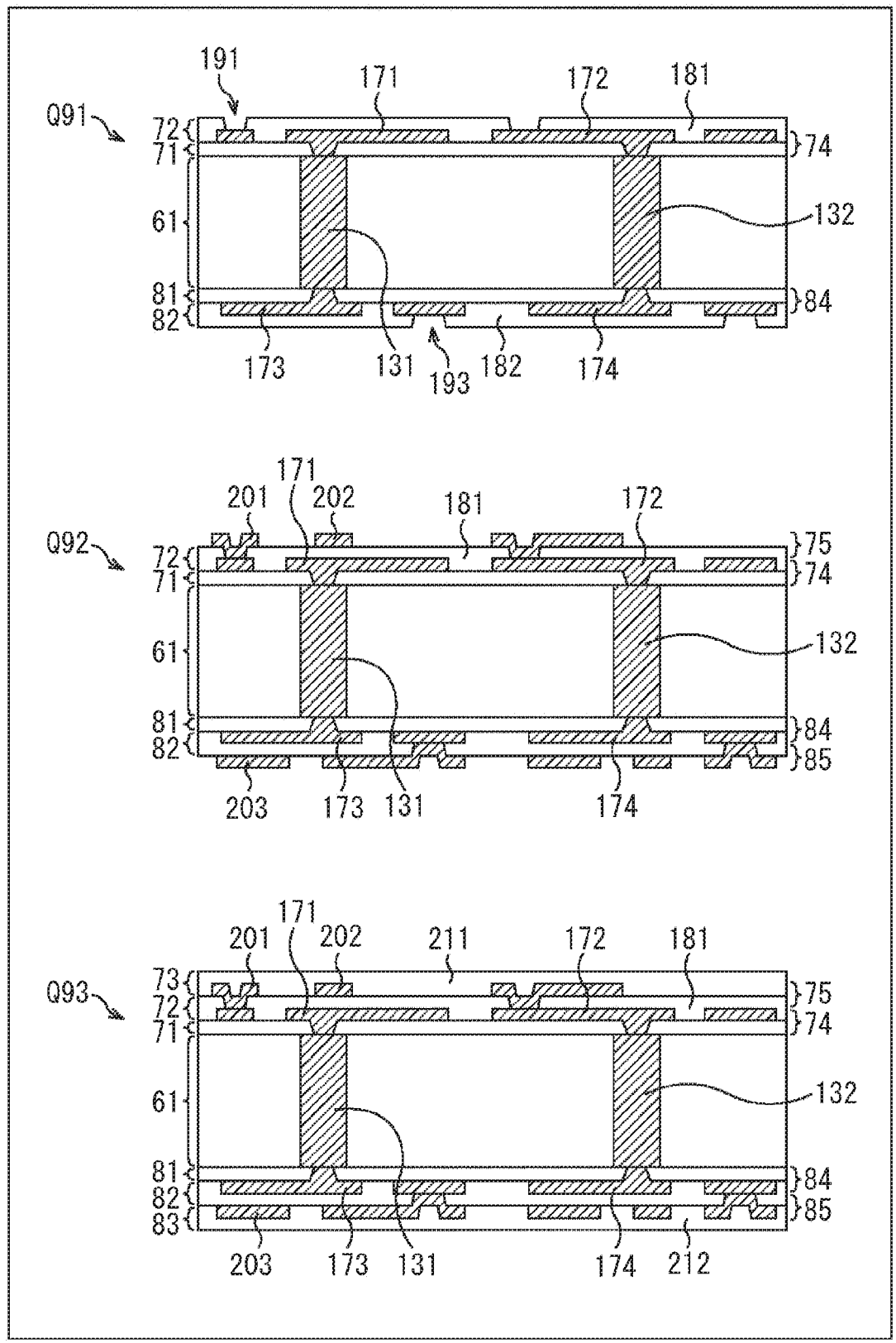
FIG. 15 is a diagram for explaining the formation of a conductive layer.
Figure 16:
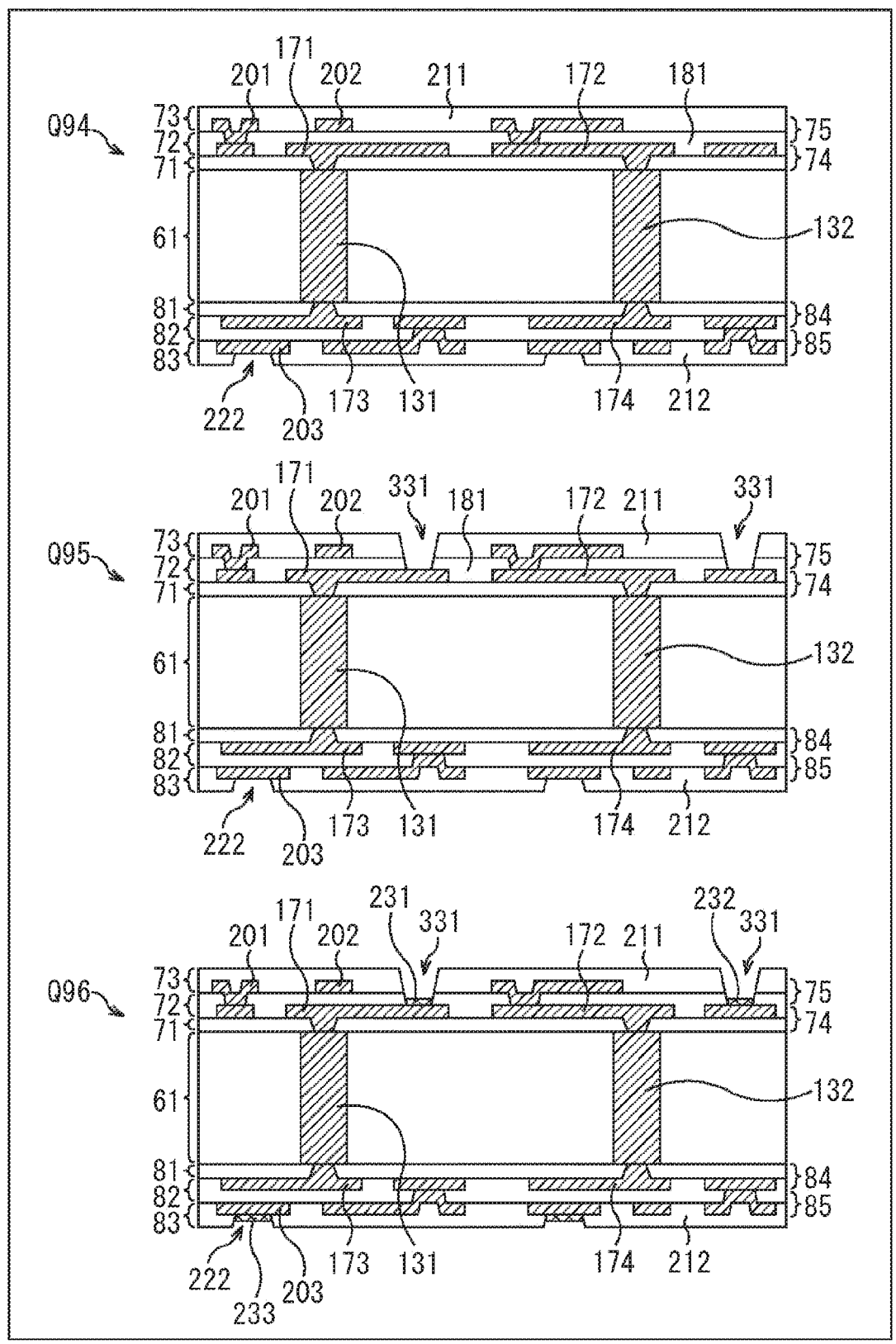
FIG. 16 is a diagram for explaining the formation of a conductive layer.

In such a case, the processes till the formation of the second insulating layer 72 and the insulating layer 82 are similar to the processes in steps S11 through S14 in FIG. 5, and thereafter, the processes (steps) shown in FIGS. 15 and 16 are performed, for example, to manufacture an imaging device. It should be noted that, in FIGS. 15 and 16, the components equivalent to those shown in FIG. 7 or 8 are denoted by the same reference numerals as those used in FIG. 7 or 8, and explanation of them will not be unnecessarily repeated.

In a case where an opening is formed by laser opening, after the steps indicated by the arrows Q11 through Q13 in FIG. 6 and the steps indicated by the arrow Q21 in FIG. 7 are carried out, an opening for connecting to the first conductive layer is formed by exposure and development, laser processing, and the like on the second insulating layer, as indicated by an arrow Q91 in FIG. 15.

In this example, exposure and development and laser processing are performed on the insulating layer film 181, and an opening 191 for connecting to the metal wiring line formed in the first conductive layer 74, and the like are formed. Likewise, exposure and development and laser processing are also performed on the insulating layer film 182, so that an opening 193 for connecting to the metal wiring line formed in the first conductive layer 84, and the like are also formed.

It should be noted that, at this stage, an opening for forming an opening penetrating through some insulating layers, such as the opening 192 shown in FIG. 7 or the like for mounting the imaging element 52, are not formed.

As indicated by an arrow Q92, a metal wiring line 201, a metal wiring line 202, and the like are formed with Cu or the like on the surface of the insulating layer 72 by a semi-additive method or the like, and the layer constituted by these metal wiring lines is turned into the second conductive layer 75. Likewise, a metal wiring line 203 and the like are formed with Cu or the like on the surface of the insulating layer 82, and the layer constituted by these metal wiring lines is turned into the second conductive layer 85.

Further, as indicated by an arrow Q93, an insulating layer film 211 is formed on the surfaces of the insulating layer 72 and the conductive layer 75 by coating, lamination, or the like, and this portion of the insulating layer film 211 is turned into the third insulating layer 73. Likewise, an insulating layer film 212 is formed on the surfaces of the insulating layer 82 and the conductive layer 85, and this portion of the insulating layer film 212 is turned into the third insulating layer 83.

After that, as shown by an arrow Q94 in FIG. 16, exposure and development and laser processing are performed on the insulating layer film 212, so that an opening 222 for connecting to the metal wiring line formed in the second conductive layer 85, and the like are formed.

Further, as indicated by an arrow Q95, laser processing is performed on the insulating layer film 211 and the insulating layer film 181, so that an opening 331 for connecting to the metal wiring line formed in the first conductive layer 74 is formed. This opening 331 is the opening equivalent to the opening 90 shown in FIG. 3, for example, and the opening 331 is an opening having a dam structure formed so as to surround the portion of the opening 133 shown in FIG. 3, which is the portion through which the core substrate 61 is exposed for light transmission.

As the opening 331 is formed in this manner, pads such as the pads 231 and the pads 232 are formed on the surfaces of the metal wiring lines of the first conductive layer 74 inside the opening 331 by electrolytic plating, electroless plating, or the like, as indicated by an arrow Q96. Pads such as pads 233 are also formed on the surface of the metal wiring line in the second conductive layer 85.

After the glass wiring board 51 is obtained by the above process, a process similar to the process in step S20 in FIG. 5 is performed, and the manufacturing process then comes to an end.

As described above, any appropriate method may be adopted as the method of forming the opening for mounting the imaging element 52.

<Example of a Pad Structure>

Figure 17:
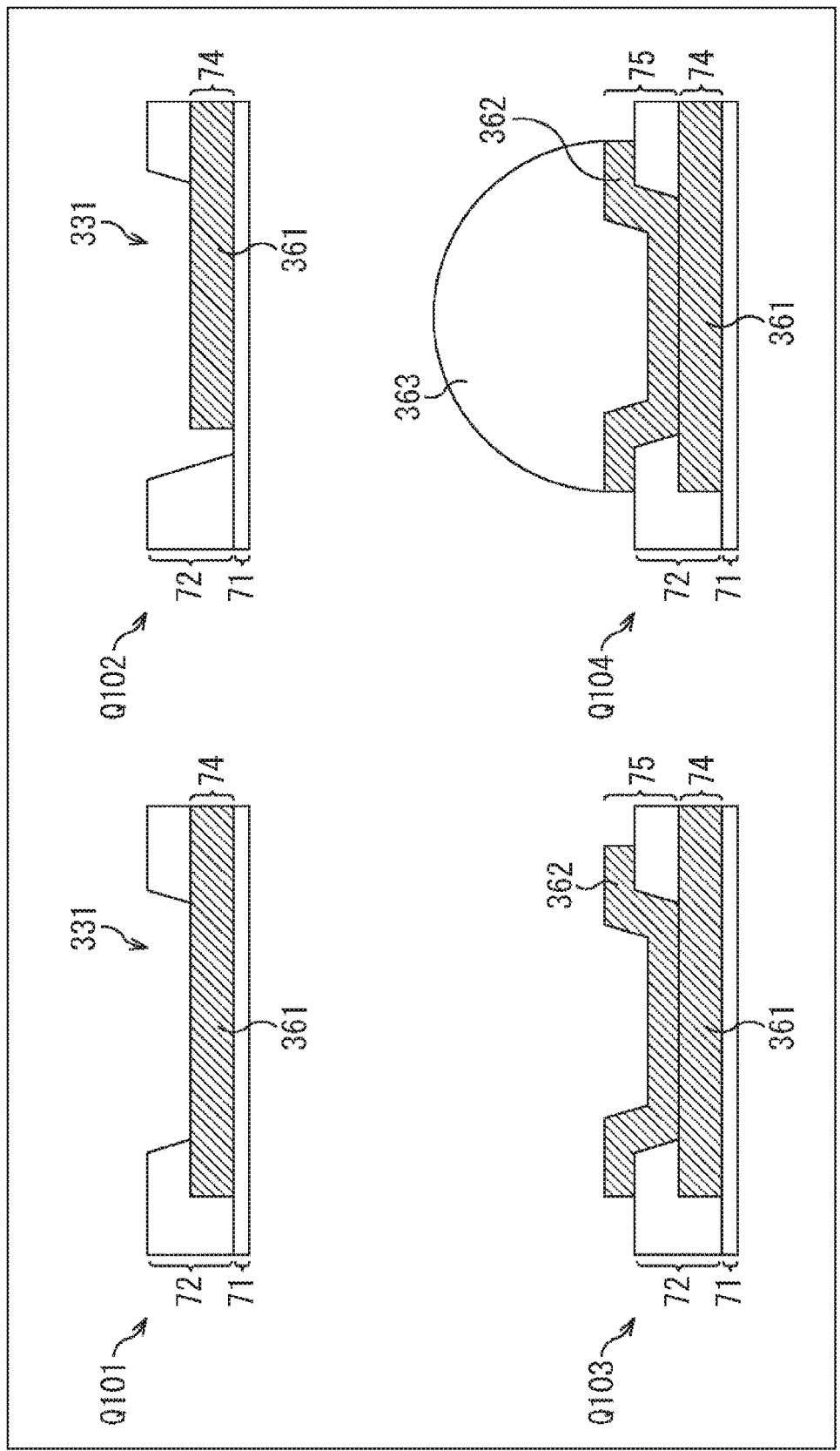
FIG. 17 is a diagram showing examples of pad structures.

Meanwhile, the respective pads such as the pads 231 and the pads 232 shown in FIG. 16, or the pad structure for mounting the imaging element 52 onto the glass wiring board 51 may have any structure, and can have the structure shown in FIG. 17, for example. It should be noted that, in FIG. 17, the components equivalent to those shown in FIG. 16 are denoted by the same reference numerals as those used in FIG. 16, and explanation of them will not be unnecessarily repeated.

In an example indicated by an arrow Q101, the portion of a metal wiring line 361 formed in the conductive layer 74 exposed through the opening 331 is a land forming a pad (a pad structure) for mounting the imaging element 52.

Also, in an example indicated by an arrow Q102, the portion of a metal wiring line 361 exposed through the opening 331 is a land as in the example indicated by the arrow Q101. In this example, however, the end portion of the metal wiring line 361 is located inside the opening 331.

Further, in an example indicated by an arrow Q103, a metal wiring line 362 forming the second conductive layer 75 is formed on the surface of the land portion of a metal wiring line 361 similar to that of the example indicated by the arrow Q101, and this metal wiring line 362 also functions as a land. That is, in this example, pads are formed with a two-layer land including the land portion of the metal wiring line 361 and the metal wiring line 362 as a land.

It should be noted that the metal wiring line 362 may be a metal wiring line forming the conductive layer 75 as long as the metal wiring line 362 is provided over the metal wiring line 361. Alternatively, the metal wiring line 362 may be a land (a pad) formed on the surface of the metal wiring line 361 after the opening 331 is formed.

Further, in the pad structure indicated by the arrow Q103, a bump 363 may be further formed on the metal wiring line 362 as indicated by an arrow Q104, and the imaging element 52 may be bump-connected with the bump 363. For example, the bump 363 may be formed with a solder such as Pb-free SnAgCu, SnAg, or the like.

It should be noted that, in the formation of the bump 363, a Cu core solder may be used for adjusting the gap between the imaging element 52 and the glass wiring board 51. A stud bump including Au or Cu may also be used as the bump 363.

In such a case, the surface of the metal wiring line 362 functioning as a land may be Au, a solder, or the like.

Further, in the examples indicated by the arrows Q101 through Q104, the metal wiring line 361 and the metal wiring line 362 may be made only of Cu subjected to OSP treatment, for example. Alternatively, the metal wiring line 361 and the metal wiring line 362 may be formed by stacking Cu, Ni, and Au, stacking Cu, Ni, Pd, and Au, stacking Cu and Ag, stacking Cu and Sn, or the like.

Figure 18:
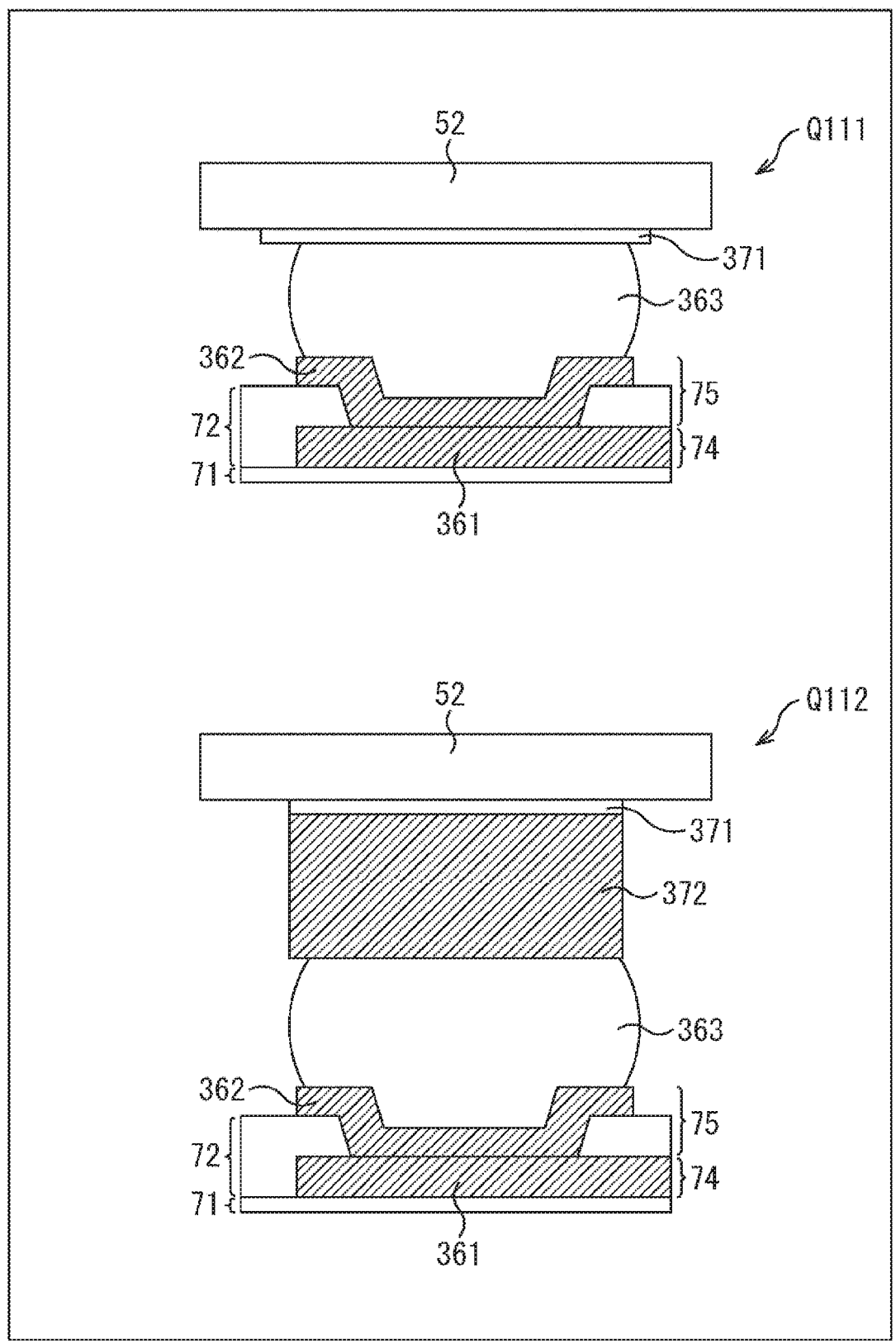
FIG. 18 is a diagram showing examples of pad structures.

Also, in the case of the pad structure indicated by the arrow Q104, for example, when the imaging element 52 is bump-connected to the glass wiring board 51, each connecting portion is as indicated by an arrow Q111 in FIG. 18, for example. It should be noted that, in FIG. 18, the components equivalent to those shown in FIG. 17 are denoted by the same reference numerals as those used in FIG. 17, and explanation of them will not be unnecessarily repeated.

In the example indicated by the arrow Q111, the metal wiring line 362 on the side of the glass wiring board 51 and a land 371 formed on the imaging element 52 are connected with the bump 363, so that the imaging element 52 is mounted on the glass wiring board 51.

Alternatively, as indicated by an arrow Q112, a Cu pillar bump 372 may be further formed on the land 371 on the side of the imaging element 52, and the Cu pillar bump 372 and the bump 363 may be connected so that the imaging element 52 is mounted on the glass wiring board 51.

Second Embodiment

<Example Structure of an Imaging Device>

Also, in the imaging device 121, part of the insulating layer located closest to a component may be brought into contact with the component, to further increase the flatness, or the parallelism, at the time of mounting of the component such as the imaging element 52.

Figure 19:
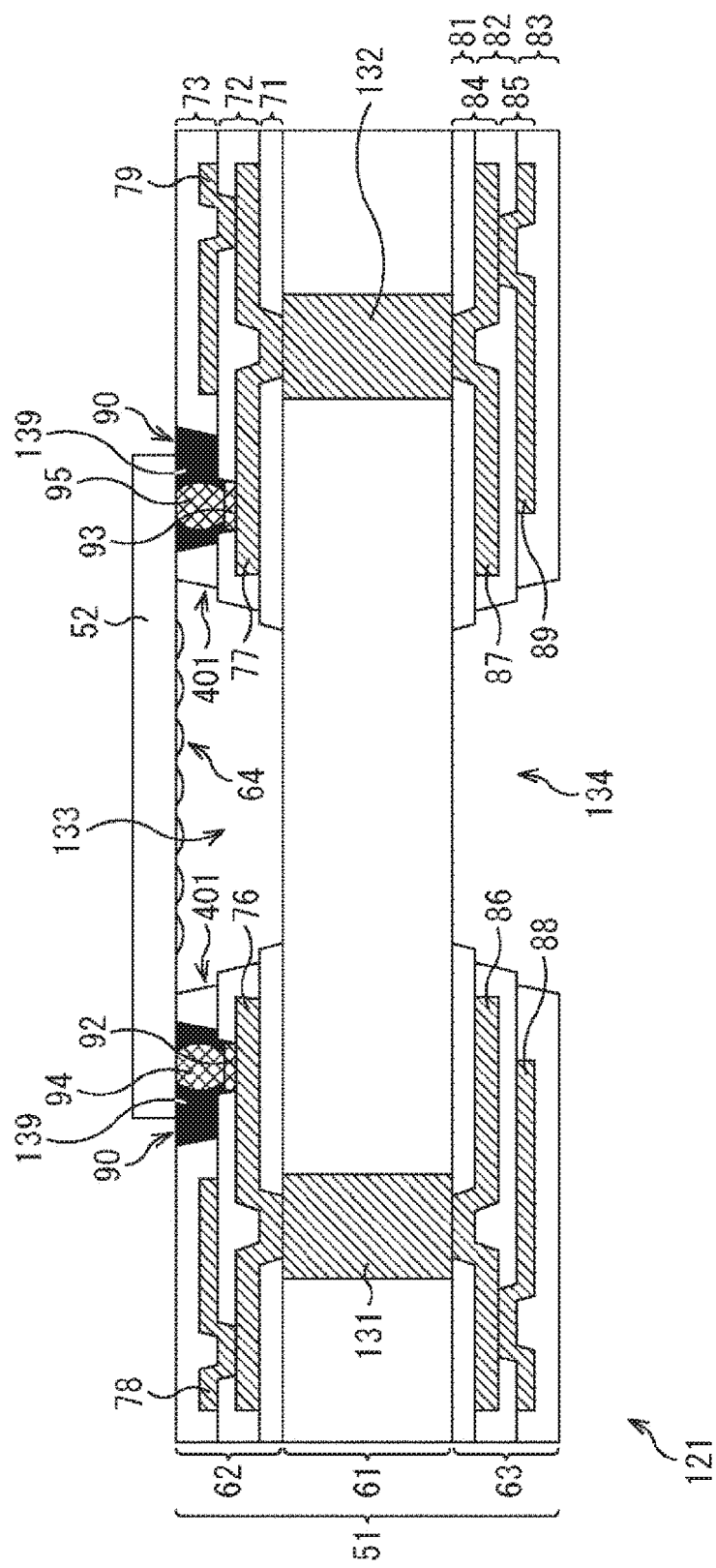
FIG. 19 is a diagram showing another example structure of an imaging device.

In such a case, the imaging device 121 is designed as shown in FIG. 19, for example. It should be noted that, in FIG. 19, the components equivalent to those shown in FIG. 3 are denoted by the same reference numerals as those used in FIG. 3, and explanation of them is not repeated herein.

In the example shown in FIG. 19, a portion provided adjacent to the light receiving portion side of the imaging element 52 with respect to the groove-like opening 90 having a dam structure in the third insulating layer 73 serves as a protruding portion 401 for preventing the underfill 139 from flowing into the light receiving portion.

The protruding portion 401 is basically the same as the protruding portion 91 shown in FIG. 3, protruding toward the imaging element 52 and having a structure for damming the underfill 139. However, the protruding portion 401 differs from the protruding portion 91 in that the surface of the protruding portion 401 is in contact with the imaging element 52 in a state where the imaging element 52 is mounted.

As the imaging element 52 is mounted on the glass wiring board 51 in a state where the protruding portion 401, which is at least part of the insulating layer 73 is in contact with the surface of the imaging element 52, or in a contact state, the flatness of the imaging element 52 can be further increased.

Third Embodiment

<Example Structure of an Imaging Device>

Alternatively, the material forming the glass wiring board 51 of the imaging device 121, or particularly, part or all of the insulating layers provided on the surface portions may be formed with an antireflective material, a material capable of blocking light, or the like. With such arrangement, unintended stray light can be prevented from being reflected and entering the light receiving portion of the imaging element 52, and thus, the occurrence of flare can be reduced.

Figure 20:
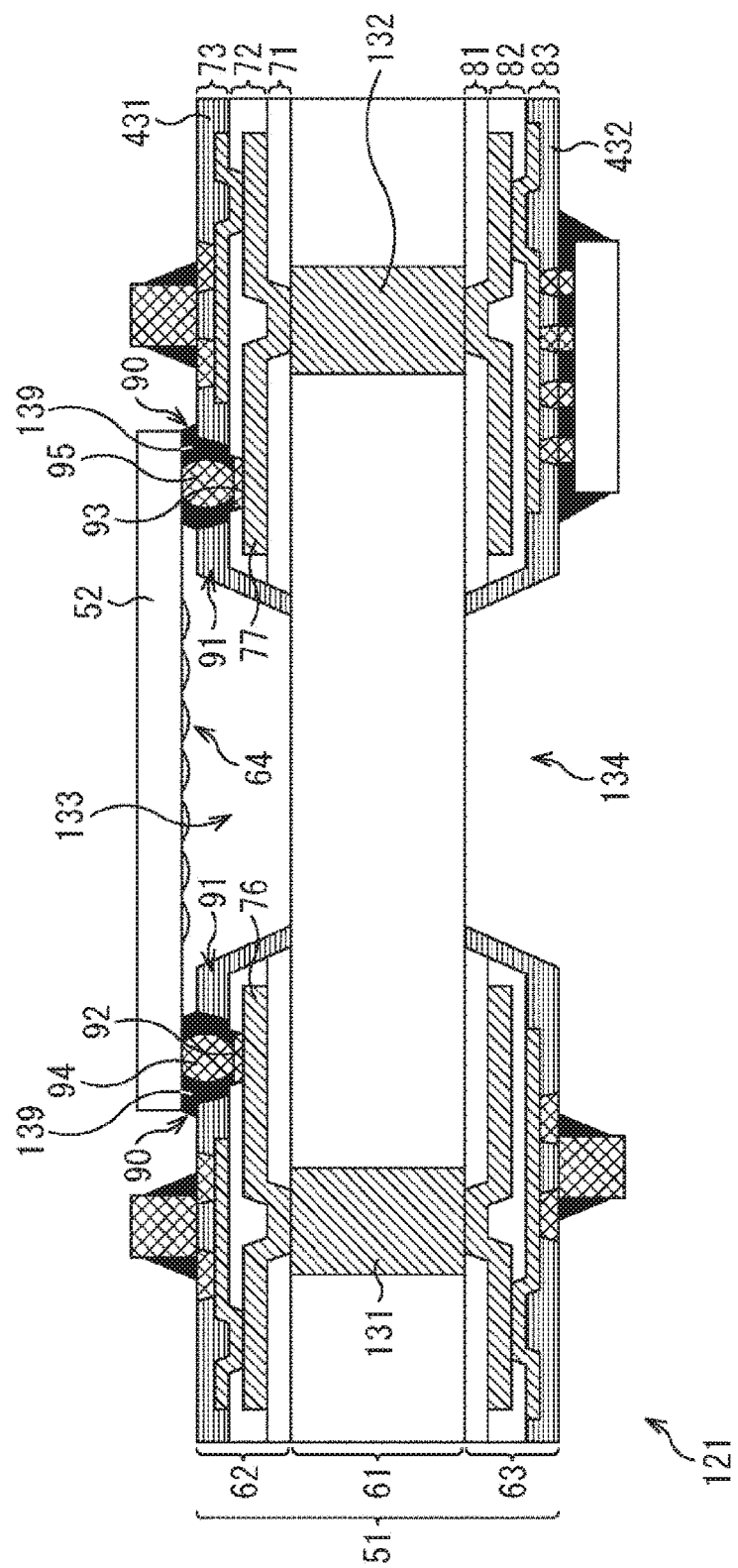
FIG. 20 is a diagram showing another example structure of an imaging device.

In a case where at least part of the insulating layers is formed with an antireflective material or a material capable of blocking light, the imaging device 121 is designed as shown in FIG. 20, for example. It should be noted that, in FIG. 20, the components equivalent to those shown in FIG. 3 are denoted by the same reference numerals as those used in FIG. 3, and explanation of them will not be unnecessarily repeated.

The imaging device 121 shown in FIG. 20 differs from the imaging device 121 shown in FIG. 3 in that an insulating layer film 431 forming the insulating layer 73 and an insulating layer film 432 forming the insulating layer 83 are formed with an antireflective material or a material capable of blocking light, and, in the other aspects, has the same structure as the imaging device 121 shown in FIG. 3.

In this example, the portions of the surfaces of the insulating layer 71 and the insulating layer 72 that are exposed in FIG. 3 are also covered with the insulating layer film 431. Likewise, the portions of the surfaces of the insulating layer 81 and the insulating layer 82 that are exposed in FIG. 3 are also covered with the insulating layer film 432.

In the example shown in FIG. 20, light that has entered the opening 134 from the outside passes through the core substrate 61 and the opening 133, and then enters the light receiving portion of the imaging element 52. At this stage, the light from the outside might enter the surfaces of the insulating layer 83 and the insulating layer 73, and become a stray light component.

In this example, however, the insulating layer film 431 forming the insulating layer 73 and the insulating layer film 432 forming the insulating layer 83 are formed with an antireflective material or a material capable of blocking light, so that light that has entered these insulating layers can be prevented from being reflected and becoming a stray light component. Thus, occurrence of flare can be prevented.

It should be noted that, in the example described herein, the entire third insulating layer 73 and the entire insulating layer 83 are formed of an antireflective material or a material capable with blocking light. However, only the surface portions of the insulating layer 73 and the insulating layer 83 may be formed with an antireflective material or a material capable of blocking light.

Fourth Embodiment

<Mounting of an Imaging Element>

Also in the imaging device 121, after the imaging element 52 is mounted in the opening 90, which is a groove portion having a dam structure shown in FIG. 3 or 4, the underfill 139 is applied, and the resin of the underfill 139 is hardened. However, the imaging element 52 may be mounted after the underfill 139 is formed.

Figure 21:
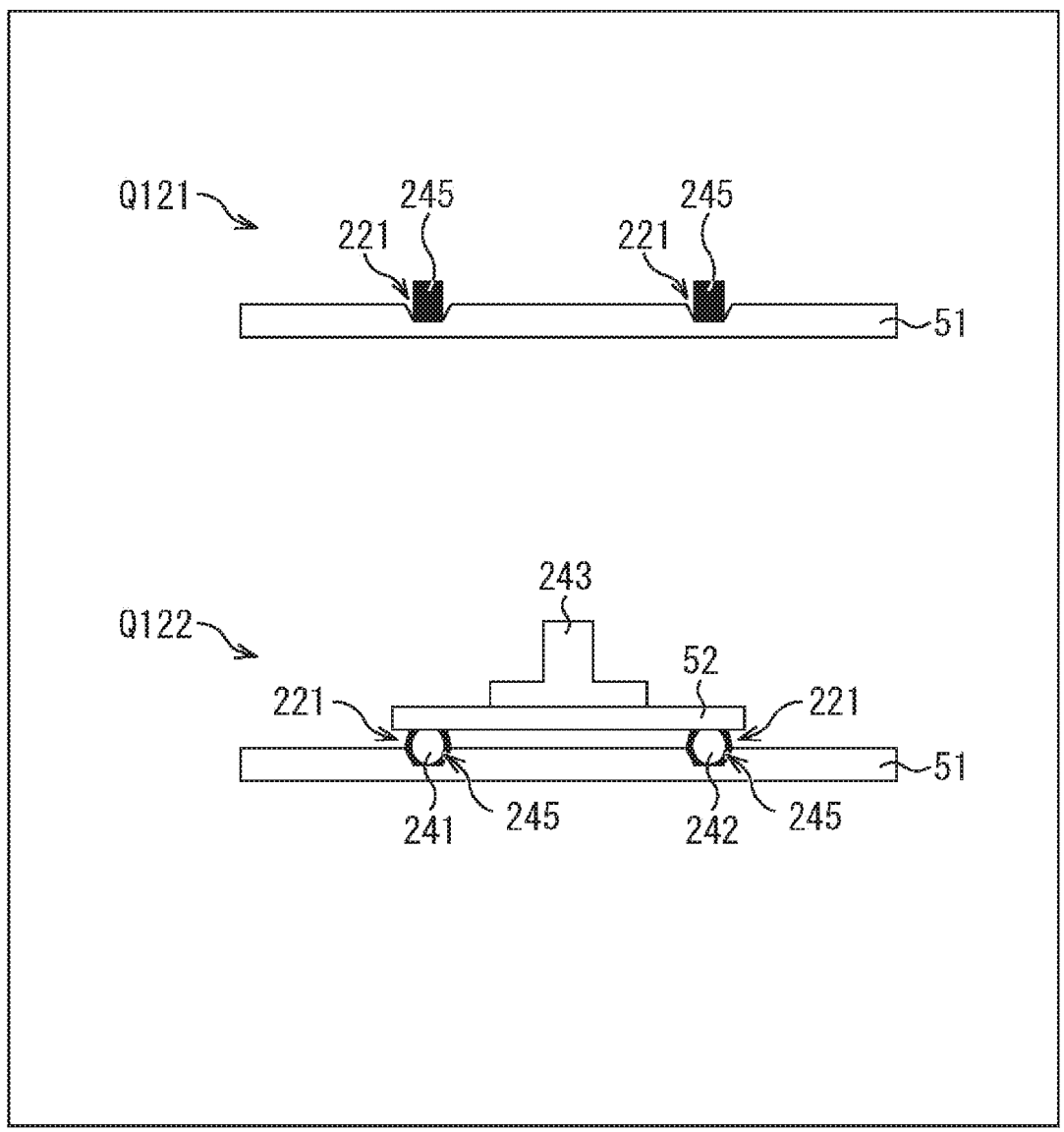
FIG. 21 is a diagram for explaining mounting of an imaging element.

In such a case, as indicated by an arrow Q121 in FIG. 21, for example, a non-conductive paste (NCP) or a non-conductive film (NCF) as the underfill 245 is formed in (applied to) the opening 221 of the glass wiring board 51 during the manufacturing process. It should be noted that, in FIG. 21, the components equivalent to those shown in FIG. 9 are denoted by the same reference numerals as those used in FIG. 9, and explanation of them will not be unnecessarily repeated.

Here, the opening 221 in FIG. 21 is a groove having a dam structure, and is equivalent to the opening 90 shown in FIG. 4. In the example shown in FIG. 21, the underfill 245 is formed beforehand in the groove-like opening 221 prior to mounting of the imaging element 52. As this groove-like opening 221 is used, the underfill 245 can be easily formed. It should be noted that, in this case, the bumps 241 and the bumps 242 are formed on the side of the imaging element 52, for example.

As indicated by an arrow Q122, the imaging element 52 is then flip-chip mounted on the glass wiring board 51 by crimping or the like with a mounting head 243. Because of this, there is no need to apply a liquid underfill after the mounting of the imaging element 52.

Alternatively, not only the underfill 245 but also a transparent resin may be formed beforehand at the pixel portions of the light receiving portion of the imaging element 52. In this case, after the imaging element 52 is mounted, the space between the light receiving portion of the imaging element 52 and the glass wiring board 51 is sealed with a transparent resin.

Fifth Embodiment

<Example Structure of an Imaging Device>

Also in the above described example shown in FIG. 4, the opening 90 is formed so as to completely surround the portion of the opening 133, or the light receiving portion of the imaging element 52, without any space. In the example shown in FIG. 4, after the imaging element 52 is mounted, the portion surrounded by the opening 90 is completely sealed with air.

Figure 22:
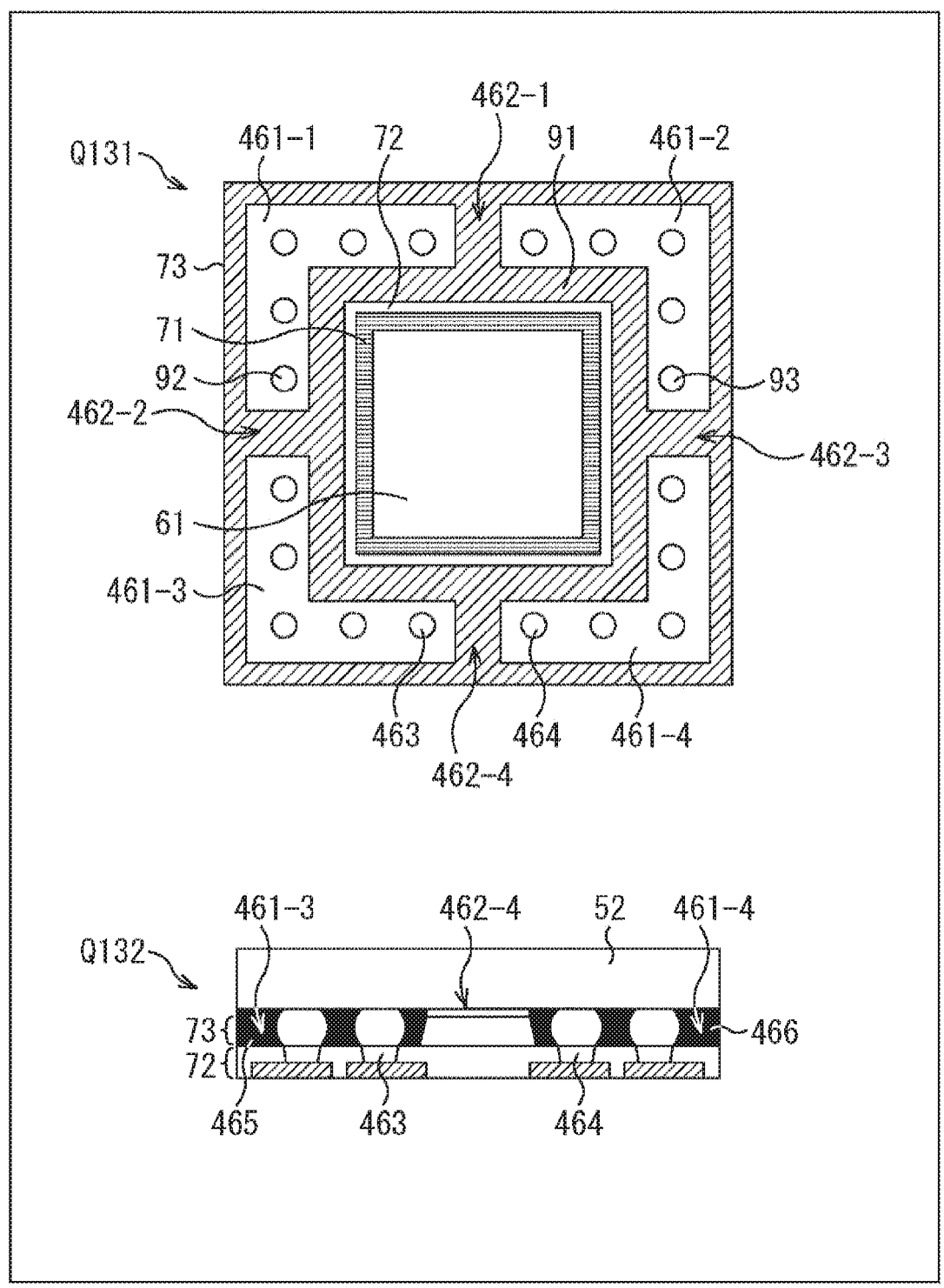
FIG. 22 is a diagram showing another example structure of openings.

On the other hand, as shown in FIG. 22, for example, the light receiving portion of the imaging element 52 may not be surrounded without any space, but a plurality of openings that surround the light receiving portion of the imaging element 52 may be formed so that air passages or vent holes are formed in part of the structure. It should be noted that, in FIG. 22, the components equivalent to those shown in FIG. 4 are denoted by the same reference numerals as those used in FIG. 4, and explanation of them will not be unnecessarily repeated.

A diagram indicated by an arrow Q131 in FIG. 22 shows the glass wiring board 51 as viewed from the normal direction of the glass wiring board 51. In this example, four L-shaped openings 461-1 through 461-4 are formed so as to surround the portion to be sealed in the space between the light receiving portion of the imaging element 52 and the core substrate 61, or the region of the portion of the glass wiring board 51 facing the imaging element 52.

Further, air passages 462-1 through 462-4 are formed between the adjacent openings 461-1 and 461-2, between the adjacent openings 461-1 and 461-3, between the adjacent openings 461-2 and 461-4, and between the adjacent openings 461-3 and 461-4, respectively. It should be noted that the openings 461-1 through 461-4 will be hereinafter also referred to simply as the openings 461 unless there is a need to specifically distinguish them from one another, and the air passages 462-1 through 462-4 will be hereinafter also referred to simply as the air passages 462 unless there is a need to specifically distinguish them from one another.

In the example indicated by the arrow Q131, the region of the portion of the glass wiring board 51 facing the imaging element 52 is surrounded by a plurality of groove-like openings 461 formed in the wiring layer 62. The air passages 462, which are vent holes for connecting the region of the portion of the glass wiring board 51 facing the imaging element 52 to an external region, are then formed between the openings 461 adjacent to one another.

Here, the bottom surface of each opening 461 is the second insulating layer 72, and pads such as the pads 92, the pads 93, pads 463, and pads 464 formed on the surface of the conductive layer 74 buried in the insulating layer 72 are provided in the portion of the insulating layer 72.

Meanwhile, the bottom surface of each air passage 462 is the third insulating layer 73, and the portions of the air passages 462 are higher than the portions of the openings 461 in the thickness direction or in the direction toward the imaging element 52 in the normal direction of the glass wiring board 51.

Even in a case where the openings 461 having a dam structure are formed as described above, the outer side and the inner side of the openings 461 are the insulating layer 73 that is higher than the insulating layer 72 on the front side or on the side of the imaging element 52 in the drawing. Particularly, in FIG. 22, the portion of the insulating layer 73 adjacent to the inner side of the openings 461 serves as the protruding portion 91, and the underfill is dammed by the protruding portion 91 and is prevented from flowing into the light receiving portion of the imaging element 52.

Further, at the time of mounting of the imaging element 52 on the glass wiring board 51, after the imaging element 52 is mounted, an underfill is applied to the openings 461 and is thermally hardened, as described above with reference to FIG. 9, for example. Alternatively, as described above with reference to FIG. 21, the imaging element 52 is mounted after underfills are formed beforehand in the openings 461.

In a state where the imaging element 52 is mounted on the glass wiring board 51, the glass wiring board 51 indicated by the arrow Q131 is as indicated by an arrow Q132, for example, when viewed in the upward direction from below. In this example, an underfill 465 is formed in the opening 461-3, and an underfill 466 is formed in the opening 461-4.

Also, the air passage 462-4, which is a ventilation space, is formed in the portion located between the imaging element 52 and the glass wiring board 51. As is apparent from this aspect, the space (the region) between the imaging element 52 and the glass wiring board 51 is not completely sealed.

For example, at the time of mounting of the imaging element 52, the underfill 465 and the underfill 466 formed in the openings 461 are fired through thermal hardening. During this thermal hardening, however, the air passages 462 serve as air passages for releasing air from the space between the imaging element 52 and the glass wiring board 51 to the outside.

Accordingly, with these air passages 462, it becomes possible to prevent an increase in the internal pressure of the portion, or the sealed portion, between the imaging element 52 and the glass wiring board 51.

The thermal hardening temperature for an underfill is normally about 130 degrees C. If thermal hardening is conducted in a state where the light receiving portion of the imaging element 52 is completely sealed, defects such as tilting of the imaging element 52 or detachment of the mounted imaging element 52 are caused due to an increase in the internal pressure of the sealed portion.

To counter this, the air passages 462 are formed in this embodiment, so that an increase in the internal pressure during the thermal hardening of the underfills is prevented, and the yield and the characteristics of the imaging device 121 can be improved.

It should be noted that, if the air passages 462 are left as they are after the thermal hardening of the underfills, dust and the like enter the light receiving portion of the imaging element 52 from the outside, and adhere to the light receiving portion, resulting in defects. Therefore, in this example, after the underfills are formed in the openings 461, an ultraviolet curable resin or a low-temperature curable resin or the like that does not cause an increase in the internal pressure is applied to the portions of the air passages 462, and the portion between the imaging element 52 and the glass wiring board 51 is completely sealed at the end.

For example, the underfills formed in the portions of the openings 461 are formed with a resin material that has a high Young's modulus but needs thermal hardening. On the other hand, the underfills for sealing the air passages 462 include a resin material that does not need firing at high temperature, unlike the underfills formed in the portions of the openings 461.

Although it is desirable to seal the portions of the air passages 462 as well at the end, the portions of the air passages 462 are not necessarily sealed. In addition, although an example in which the L-shaped openings 461 and the air passages 462 are provided has been described herein, this is merely an example, and any designs may be adopted as the openings surrounding the portion between the imaging element 52 and the glass wiring board 51, and the air passages provided adjacent to the openings.

Sixth Embodiment

<Example Structure of an Imaging Device>

Also in the example shown in FIG. 22, the air passages 462 may not be sealed with resin or the like after the underfills formed in (applied to) the openings 461 are fired. Instead, a transparent resin may be introduced into the portion between the imaging element 52 and the glass wiring board 51 via the air passages 462, and be then sealed.

In such a case, a transparent resin is injected (embedded) into the portion surrounded by the openings 461 from the air passages 462, or the portion between the imaging element 52 and the glass wiring board 51, and sealing is performed with the transparent resin. Because of this, even if heat is applied to the imaging device 121 (a package) after the sealing with the transparent resin, the internal pressure of the portion between the imaging element 52 and the glass wiring board 51 does not rise.

Figure 23:
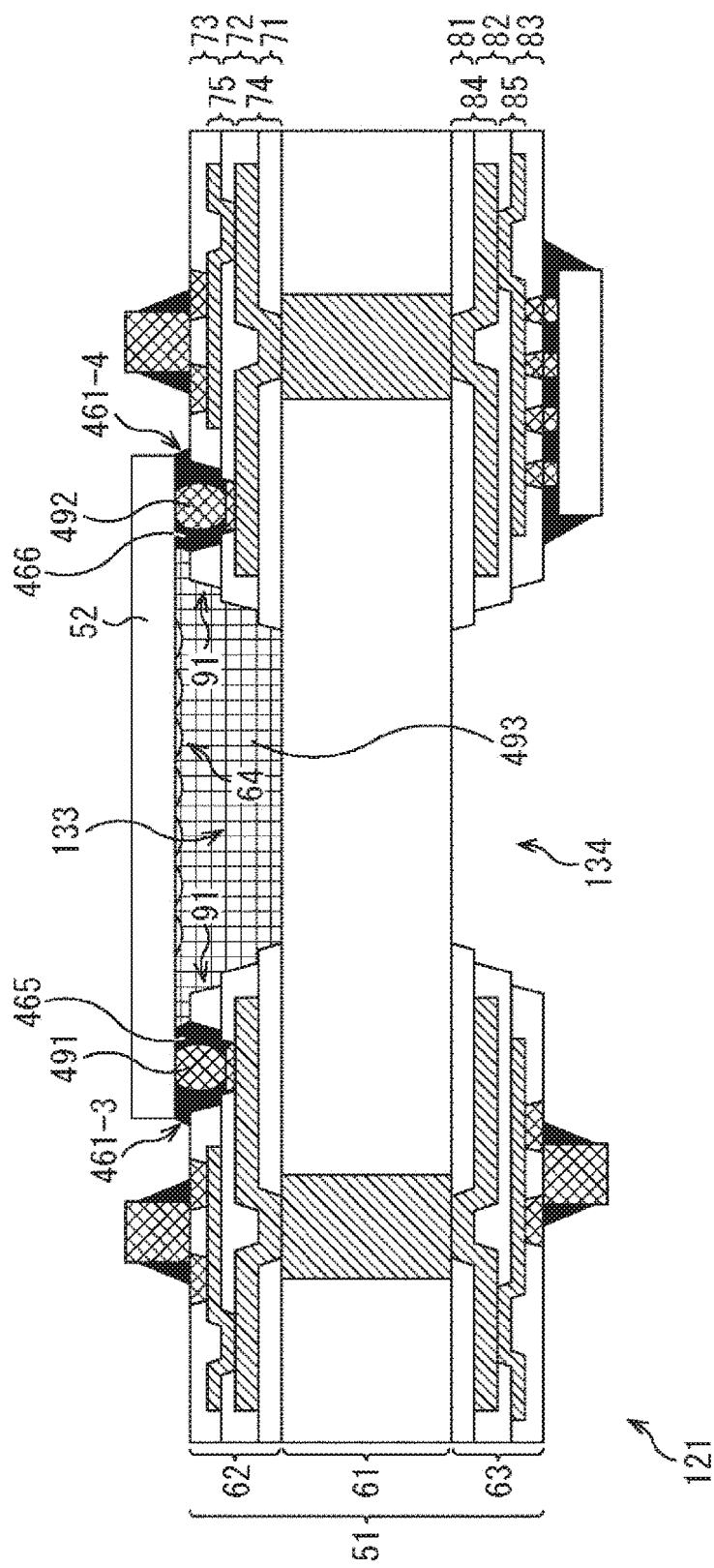
FIG. 23 is a diagram showing another example structure of an imaging device.

In a case where a transparent resin is embedded in the portion between the imaging element 52 and the glass wiring board 51 in this manner, the imaging device 121 is designed as shown in FIG. 23, for example. It should be noted that, in FIG. 23, the components equivalent to those shown in FIG. 3 or 22 are denoted by the same reference numerals as those used in FIG. 3 or 22, and explanation of them will not be unnecessarily repeated.

In the example shown in FIG. 23, openings 461 are formed in the build-up multilayer wiring layer 62 of the glass wiring board 51 on the side of the imaging element 52, and the imaging element 52 is mounted on the glass wiring board 51 with bumps 491 and bumps 492 provided in those openings 461.

An underfill 465 and an underfill 466 are also formed in the respective openings 461. In addition, the portion of the opening 133 of the imaging device 121, or the space surrounded by the openings 461, the imaging element 52, and the core substrate 61 is filled with a transparent resin 493 injected from air passages 462 (not shown). In other words, the portion between the imaging element 52 and the glass wiring board 51 is completely sealed with the transparent resin 493.

Here, the transparent resin 493 is a resin or the like whose Young's modulus is as low as possible, in consideration of the influence on warpage of the imaging element 52, for example. Further, to prevent degradation of imaging characteristics due to reflection of incident light at the interface between the light-transmissive core substrate 61 and the transparent resin 493, the material of the transparent resin 493 is selected so that the refractive index of the transparent resin 493 becomes equal to or substantially the same as the refractive index of the core substrate 61, for example.

Seventh Embodiment

<Example Structure of an Imaging Device>

Further, as for the protruding portion 91 for damming an underfill, only part of the insulating layers forming the build-up multilayer wiring layers 62 and 63 may be made thicker than the other insulating layers. With this arrangement, it becomes possible to improve the effect to dam the underfill, and facilitate adjustment the mounting height of the imaging element 52. As for the wiring lines, on the other hand, fine processing is easier in a case where the insulating layers are thin.

Figure 24:
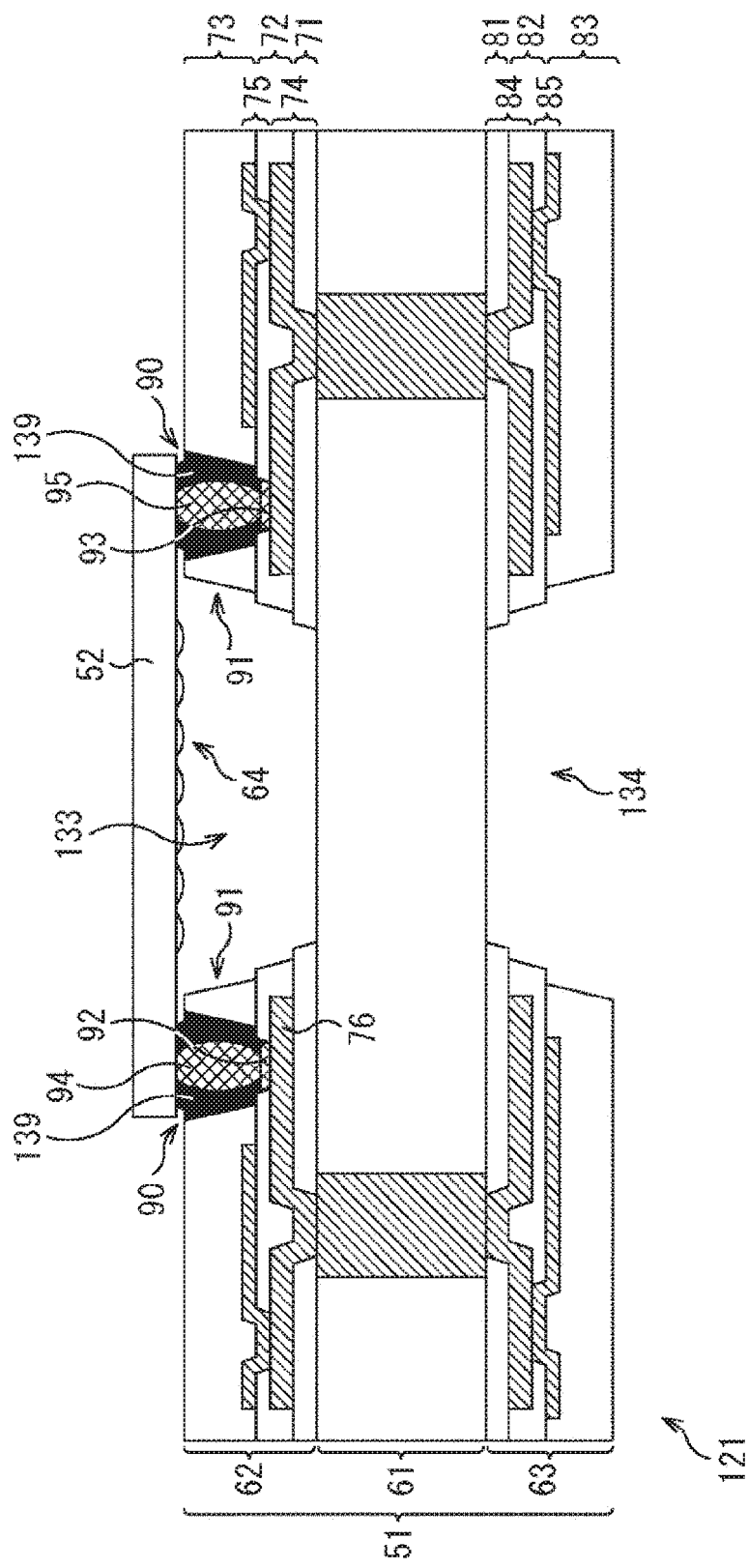
FIG. 24 is a diagram showing another example structure of an imaging device.

In view of this, the insulating layer 73 and the insulating layer 83 located on the outermost sides of the glass wiring board 51 may be made thicker than the other insulating layers, which are the insulating layer 71, the insulating layer 72, the insulating layer 81, and the insulating layer 82, as shown in FIG. 24, for example. It should be noted that, in FIG. 24, the components equivalent to those shown in FIG. 3 are denoted by the same reference numerals as those used in FIG. 3, and explanation of them will not be unnecessarily repeated.

In the example shown in FIG. 24, the thicknesses of the outermost insulating layers 73 and 83 in the vertical direction, which is the normal direction of the glass wiring board 51, are greater than the thicknesses of the insulating layer 71, the insulating layer 72, the insulating layer 81, and the insulating layer 82, which are located on the inner sides. Accordingly, it is possible not only to facilitate adjustment of the mounting height of the imaging element 52, but also to increase the height of the protruding portion 91 to improve the effect to dam the underfill 139.

Also, since the thicknesses of the insulating layer 71, the insulating layer 72, the insulating layer 81, and the insulating layer 82 provided on the inner layer side are sufficiently thin, fine processing such as forming fine metal wiring lines can be easily performed on the conductive layers. It should be noted that adjustment of the mounting height of a mounted component such as the imaging element 52 may be performed by adjusting the thicknesses of the respective insulating layers such as the insulating layer 71 and the insulating layer 72, for example.

As the thickness of each insulating layer is appropriately adjusted in the above manner, it is possible to optimize the structure of the entire glass wiring board 51. It should be noted that the example shown in FIG. 24 is merely an example, and it is also possible to increase the mounting height of the imaging element 52 by increasing the thickness of the first insulating layer 71. Further, to uniformize the thickness-direction film stress to be applied to the glass wiring board 51 on the front and back surfaces, the thicknesses and the structures of the insulating layers formed on the front and back surfaces, or the thicknesses and the structures of the respective insulating layers of the wiring layer 62 and the wiring layer 63 are preferably made as symmetrical as possible.

Eighth Embodiment

<Example Structure of an Imaging Device>

As for the underfill damming structure, hydrophilic treatment or water repellent treatment may also be applied part or all of the insulating layer 73, to further increase the underfill damming effect.

Figure 25:
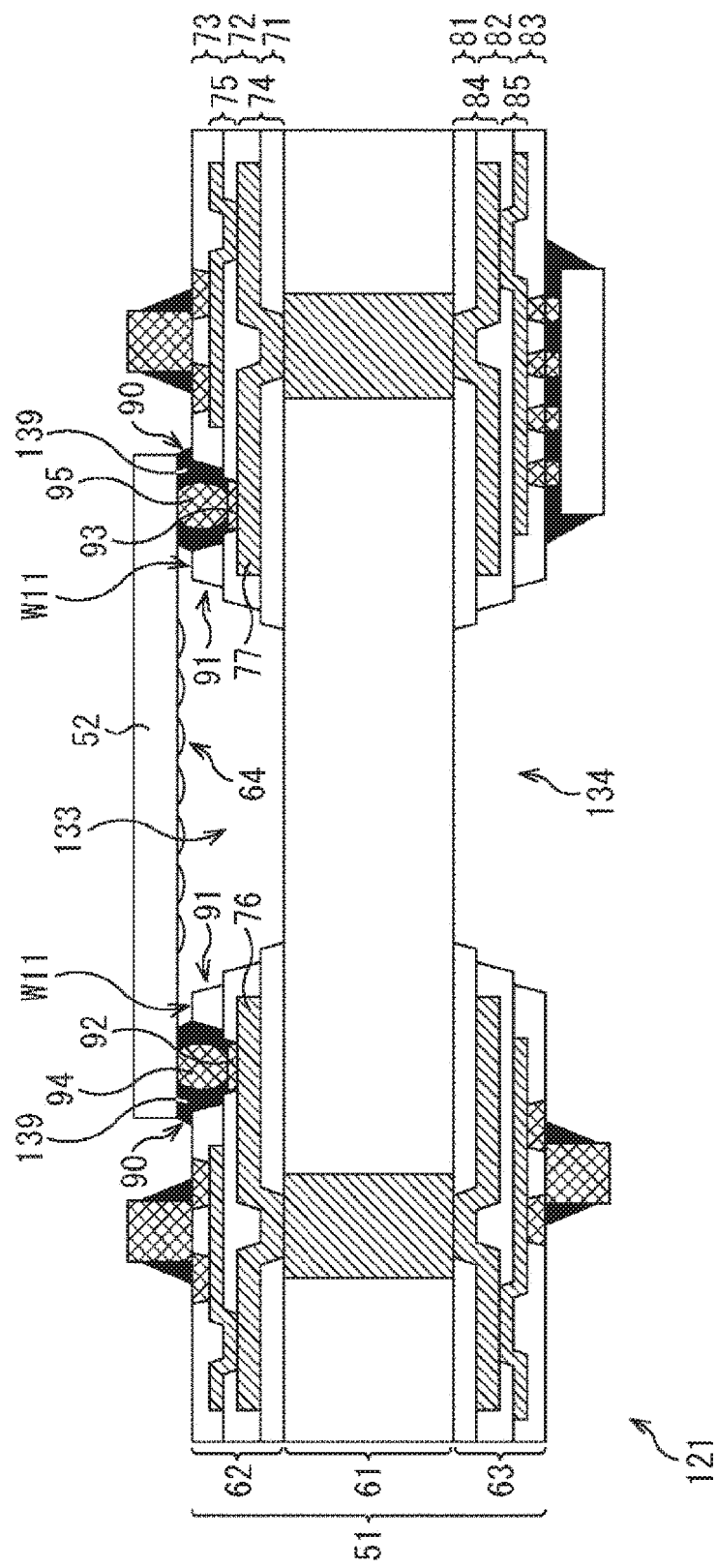
FIG. 25 is a diagram showing another example structure of an imaging device.

In such a case, the imaging device 121 is designed as shown in FIG. 25, for example. It should be noted that, in FIG. 25, the components equivalent to those shown in FIG. 3 are denoted by the same reference numerals as those used in FIG. 3, and explanation of them will not be unnecessarily repeated.

In the example shown in FIG. 25, hydrophilic treatment or water repellent treatment is performed on the surface portion of the protruding portion 91 formed in the insulating layer 73, or the portion of the protruding portion 91 facing the imaging element 52, as indicated by an arrow W11. With this arrangement, the underfill 139 can be prevented from flowing out of the opening 90 when the underfill 139 is applied to the opening 90. That is, the effect to dam the underfill 139 can be increased.

It should be noted that hydrophilic treatment or water repellent treatment may be performed not only on the protruding portion 91, but also on part of the slope portion of the opening 90 on the side of the protruding portion 91, and the outer side of the opening 90 on the surface of the insulating layer 73, or the portion on the opposite side of the opening 90 from the center side of the glass wiring board 51, or the like.

Here, the hydrophilic treatment or the water repellent treatment for the surface portion or the like of the protruding portion 91 can be performed by subjecting the target region to plasma treatment or forming a thin film such as a metal film on the target region, for example.

Ninth Embodiment

<Example Structure of an Electronic Apparatus>

It should be noted that examples in which the present technology is applied to the imaging device 121 have been described so far. However, the present technology can be applied to a semiconductor device that differs from the imaging device 121 and has a component such as a semiconductor element, or particularly, a component having a space that is formed between the component and a substrate and is preferably sealed. The present technology can also be applied to any electronic apparatus equipped with various kinds of semiconductor devices including the imaging device 121.

Figure 26:
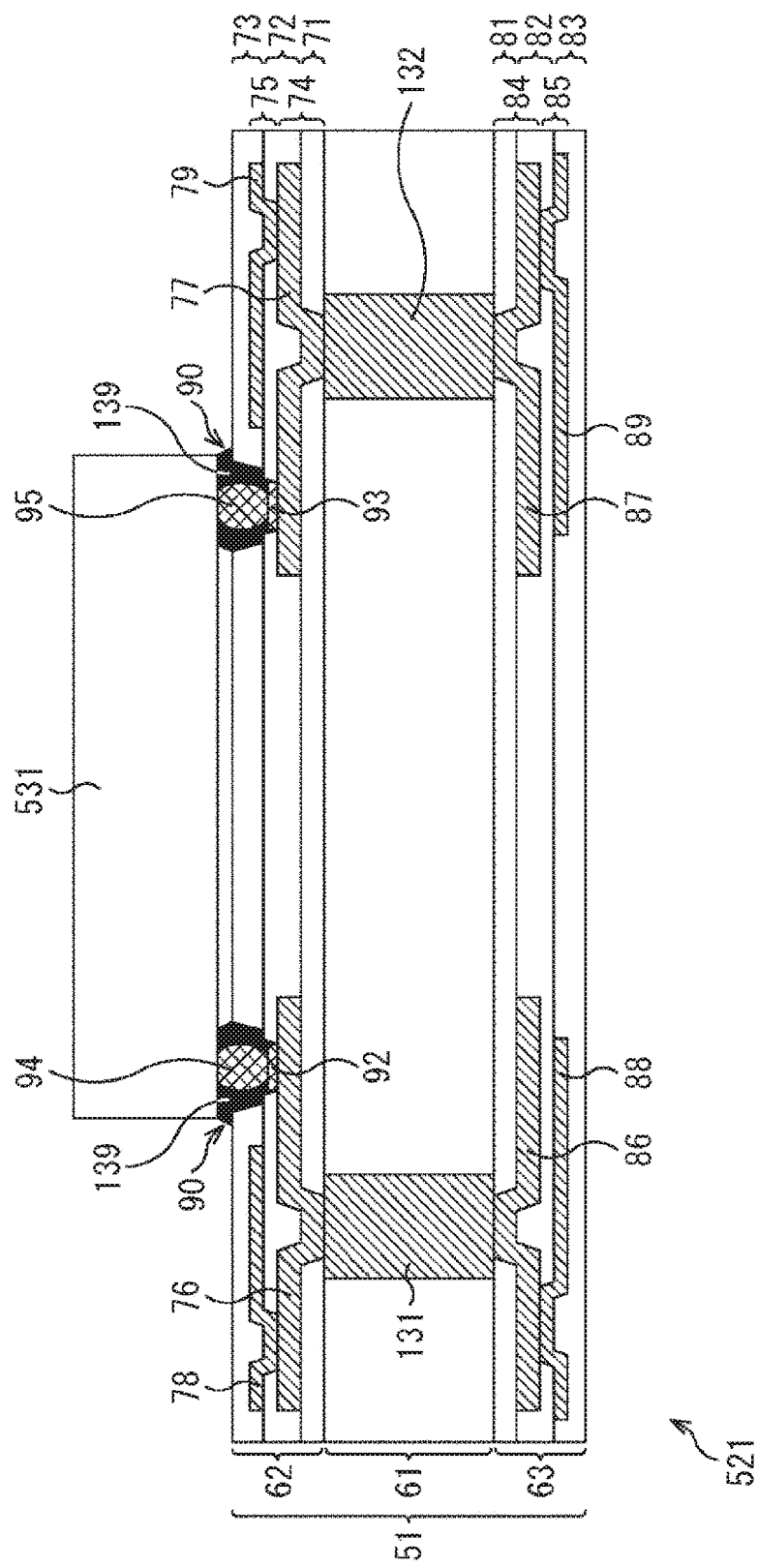
FIG. 26 is a diagram showing an example structure of an electronic apparatus to which the present technology is applied.

For example, the present technology can also be applied to a semiconductor device shown in FIG. 26. It should be noted that, in FIG. 26, the components equivalent to those shown in FIG. 3 are denoted by the same reference numerals as those used in FIG. 3, and explanation of them will not be unnecessarily repeated.

In the example shown in FIG. 26, a semiconductor device 521 is formed with the glass wiring board 51 and a micro electro mechanical systems (MEMS) element 531 that is mounted on the glass wiring board 51 and has a mechanical structure.

In this example, the opening 133 and the opening 134 shown in FIG. 3 are not formed in the glass wiring board 51.

Further, the MEMS element 531, which is an example of a mount element, is flip-chip mounted on the glass wiring board 51 with the bumps 94 and the bumps 95 provided inside an opening 90.

Here, the bumps 94 and the bumps 95 are formed on the pads 92 and the pads 93 formed on the conductive layer 74 closer to the core substrate 61 than the conductive layer 75 provided on the outermost side, as in the case shown in FIG. 3. Also, the underfill 139 is formed in the portion of the opening 90, and thus, the portion between the MEMS element 531 and the glass wiring board 51 is sealed.

Particularly, in a case where a mechanical structure is provided at a portion of the surface of the MEMS element 531 facing the glass wiring board 51, the portion of the mechanical structure is sealed, so that dust and the like are prevented from adhering to the portion of the mechanism structure, and characteristics can be improved.

Tenth Embodiment

<Example Structure of an Imaging Device>

It should be noted that imaging elements and an MEMS element have been described as examples of mount elements (components) to be mounted on a substrate with high flatness and at low cost. However, the present technology may also be applied in other cases, such as a case where a lens structure or the like is mounted on a substrate, for example.

Figure 27:
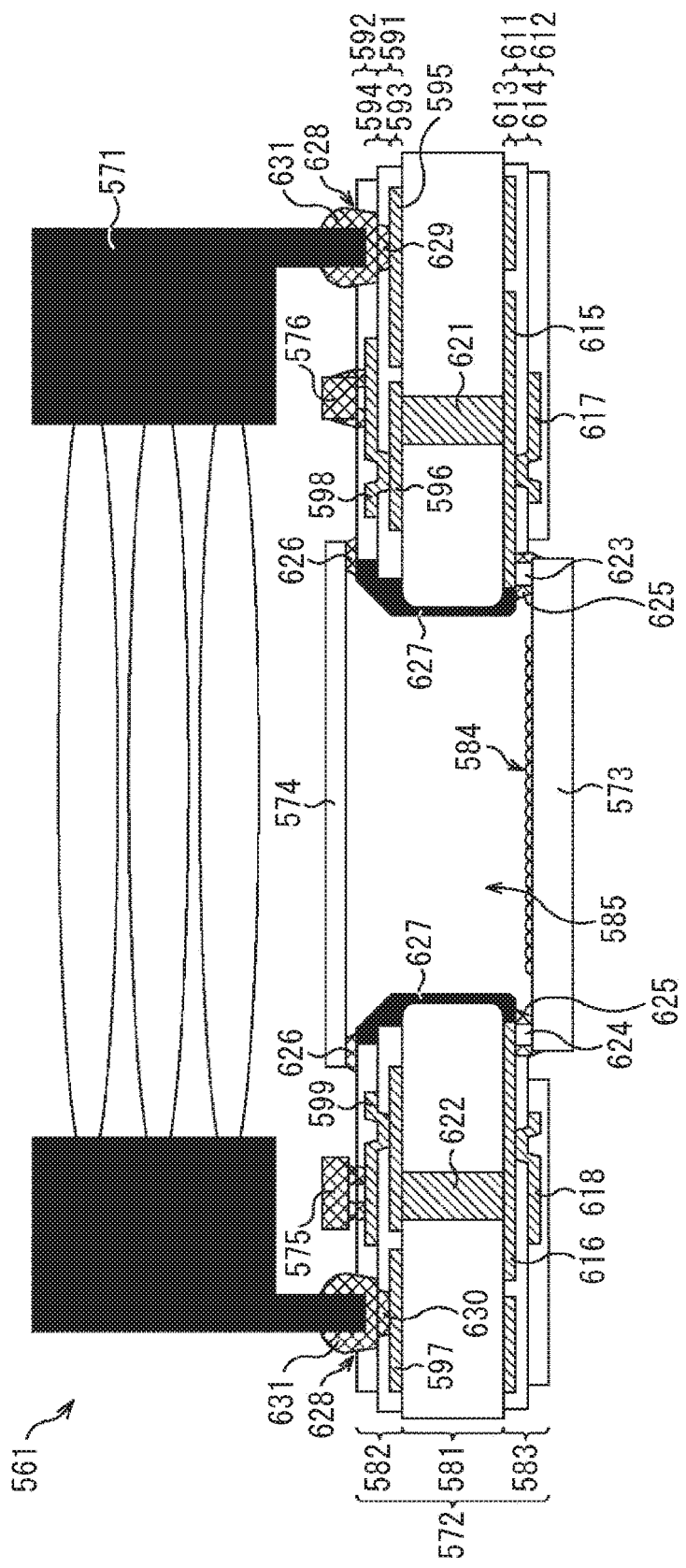
FIG. 27 is a diagram showing another example structure of an imaging device.

In such a case, an imaging device to which the present technology is applied is designed as shown in FIG. 27, for example.

An imaging device 561 shown in FIG. 27 includes a lens system 571 formed with one or a plurality of lenses, a glass wiring board 572, an imaging element 573, a sealing member 574, an active element 575, and a passive element 576.

The glass wiring board 572 is formed with a core substrate 581 including borosilicate glass or the like, for example, and a wiring layer 582 and a wiring layer 583 that are build-up multilayer wiring layers formed on both surfaces of the core substrate 581. The wiring layer 582 and the wiring layer 583 each include a plurality of insulating layers and a plurality of conductive layers.

Also, microlenses and color filters are formed on the light receiving portion 584 of the imaging element 573 that is an image sensor. With the light receiving portion 584 facing a side of the glass wiring board 572, the imaging element 573 is mounted on the glass wiring board 572. That is, the imaging element 573 is mounted so that the light receiving portion 584 of the imaging element 573 faces the glass wiring board 572.

Further, an opening 585 that is an opening penetrating through the core substrate 581, the wiring layer 582, and the wiring layer 583 is formed in the central portion of the glass wiring board 572, or in the portion facing the light receiving portion 584 of the imaging element 573.

On the glass wiring board 572, the imaging element 573 and the sealing member 574 are fixed so that the imaging element 573 and the sealing member 574 face each other via the opening 585. Therefore, the space in the portion of the opening 585, or the opening 585 and the light receiving portion 584 are sealed with the imaging element 573 and the sealing member 574, to prevent dust and the like from entering from the outside.

The wiring layer 582 has a first insulating layer 591 located on the innermost layer side, which is the side of the core substrate 581, and a second insulating layer 592 that formed on the outer side of the insulating layer 591 or on the side farthest from the core substrate 581. The insulating layer 591 and the insulating layer 592 are insulating layers including polyimide, for example.

Further, a first conductive layer 593 is formed in the portion of the insulating layer 591 of the wiring layer 582, and a second conductive layer 594 is formed in the portions of the insulating layer 591 and the insulating layer 592.

In this example, the first conductive layer 593 located closest to the core substrate 581 is formed with a metal wiring line 595, a metal wiring line 596, a metal wiring line 597, and the like that include copper (Cu) or the like, for example. Also, the second conductive layer 594 located on the outermost side, which is the side furthest from the core substrate 581, is formed with a metal wiring line 598 and a metal wiring line 599 that include Cu or the like, for example.

Likewise, the wiring layer 583 includes the first insulating layer 611 and the second insulating layer 612 that is formed on the outer side of the insulating layer 611 and is located on the outermost side, and the insulating layer 611 and the insulating layer 612 are also insulating layers including polyimide, for example.

Also, a first conductive layer 613 is formed in the portion of the insulating layer 611 of the wiring layer 583, and a second conductive layer 614 is formed in the portions of the insulating layer 611 and the insulating layer 612.

In this example, the first conductive layer 613 located closest to the core substrate 581 is formed with a metal wiring line 615, a metal wiring line 616, and the like that include Cu or the like, for example, and the second conductive layer 614 located on the outermost side is formed with a metal wiring line 617 and a metal wiring line 618 that are made or Cu or the like, for example.

Further, a through electrode 621 and a through electrode 622 that penetrate through the core substrate 581 and electrically connect the conductive layer 593 formed on one surface to the conductive layer 613 formed on the other surface are provided in the core substrate 581.

For example, the metal wiring line 596 forming the conductive layer 593 is connected to one end of the through electrode 621, and the metal wiring line 615 forming the conductive layer 613 is connected to the other end of the through electrode 621. In this manner, the front and back surfaces of the core substrate 581 are electrically connected to each other by the through electrode 621 and the through electrode 622.

In addition, the imaging element 573 is mounted on the glass wiring board 572 with bumps 623 provided on the metal wiring line 615, bumps 624 provided on the metal wiring line 616, and the like. In other words, the imaging element 573 and the glass wiring board 572 are electrically and physically connected with the bumps 623 and the bumps 624.

Also in the imaging device 561, the imaging element 573 is bump-connected directly to the conductive layer 613 located on the inner side of the outermost conductive layer 614 in the above manner, so that the imaging element 573 can be mounted on the glass wiring board 572 with high flatness and at low cost. Further, as the distance between the imaging element 573 and the core substrate 581 can be shortened, low-profile mounting can also be realized.

An underfill 625 that is a sealing resin is applied to the portions of the bumps 623 and the bumps 624 for bump-connection of the imaging element 573, and the portion of the opening 585 is sealed with the underfill 625. In this example, the portion of the sealed opening 585 is filled with air.

Further, the sealing member 574 is fixed (bonded) to the surface of the outermost insulating layer 592 with an adhesive 626.

It should be noted that any appropriate method may be adopted as the method of forming the opening 585 by opening the core substrate 581, or the glass wiring board 572.

An example of the method of forming the opening 585 is a method of forming the wiring layer 582 and the wiring layer 583 on both surfaces of the core substrate 581, for example, opening the portion of the opening 585 in the glass wiring board 572, and then mounting the imaging element 573 and the like.

A low-reflective material 627 is formed on the inner wall portion of the glass wiring board 572 exposed through the portion of the opening 585, or on the portions of the core substrate 581, the wiring layer 582, and the wiring layer 583 on the side of the opening 585. In other words, the low-reflective material 627 is formed so that the end portion of the glass wiring board 572 on the side of the opening 585 is covered with the low-reflective material 627 that reduces reflection of light.

In the imaging device 561, light from the outside (the object) enters the light receiving portion 584 of the imaging element 573 through the lens(es) of the lens system 571, the sealing member 574, and the opening 585. Therefore, the low-reflective material 627 is provided in the imaging device 561, so that light from the outside can be prevented from being reflected by the core substrate 581 or the like and entering the light receiving portion 584, and the occurrence of flare can be reduced.

Also, in the glass wiring board 572, the active element 575 is connected, via pads and bumps, to the metal wiring line 599 provided in the outermost conductive layer 594. Likewise, the passive element 576 is connected, via pads and bumps, to the metal wiring line 598 provided in the outermost conductive layer 594. The active element 575 and the passive element 576 are disposed (mounted) on the surface of the wiring layer 582 on the side of the lens system 571.

Further, in the wiring layer 582, an opening 628 penetrating through at least the outermost insulating layer 592 is formed. It should be noted that the opening 628 should penetrate at least the outermost insulating layer 592, and be connectable to the conductive layer located closer to the core substrate 581 than the outermost conductive layer 594.

Particularly, in this example, the opening 628 is formed so as to surround the central portion of the glass wiring board 572 on which the sealing member 574, the active element 575, and the passive element 576 are disposed.

Also, in the wiring layer 582, pads 629 and pads 630 are formed on the portions of the metal wiring line 595 and the metal wiring line 597 inside the opening 628.

In addition, part of the holding housing for holding the lenses constituting the lens system 571 is inserted into the portion at which the pads 629 and the pads 630 are formed in the opening 628, and is secured by an adhesive member 631 formed with an adhesive such as a resin, a solder, or the like. That is, while part of the lens system 571 is inserted in the opening 628, the lens system 571 is secured to the glass wiring board 572, or the core substrate 581, with the adhesive member 631.

It should be noted that part of the lens system 571 may be electrically connected to the metal wiring line 595 and the like via the pads 629, the pads 630, a solder, and the like, for example. That is, the lens system 571 and the glass wiring board 572 may be electrically connected to each other.

In this example, as the opening 628 is formed, the lens system 571 is connected directly to the conductive layer 593 located on the inner layer side of the outermost conductive layer 594, and the portion of the lens system 571 on the side of the glass wiring board 572 can be disposed at a position close to the core substrate 581 on the inner layer side. As a result, the lens system 571 can be mounted on the glass wiring board 572 with high flatness and at low cost, as in the case with the imaging element 573. That is, the mounting accuracy of the lens system 571 on the glass wiring board 572 can be increased at low cost.

It should be noted that an example in which the imaging element 573 is provided on the surface of the glass wiring board 572 on the opposite side from the lens system 571 has been described herein. However, the imaging element 573 may be disposed at a position where the sealing member 574 is provided. Alternatively, the opening penetrating through the core substrate 581 may not be formed.

Eleventh Embodiment

<Example Structure of an Imaging Device>

Also in the imaging device 561 shown in FIG. 27, the lens system 571 is secured to the glass wiring board 572. However, the lens system 571 may not be provided.

Figure 28:
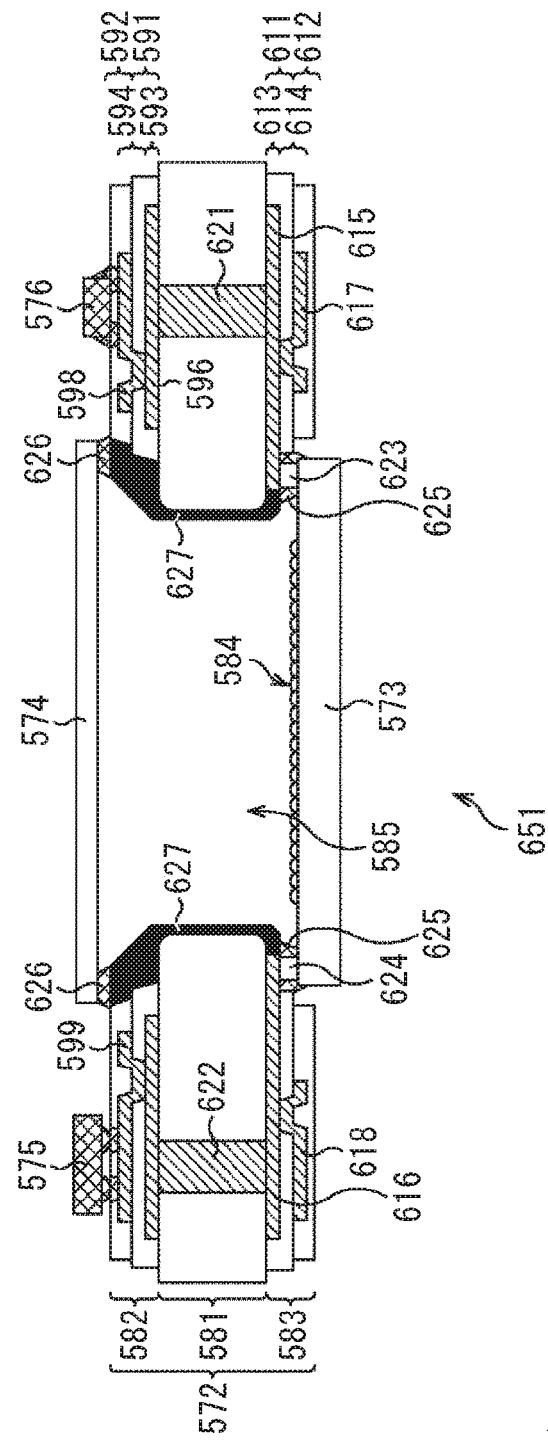
FIG. 28 is a diagram showing another example structure of an imaging device.

In such a case, an imaging device is designed as shown in FIG. 28, for example. It should be noted that, in FIG. 28, the components equivalent to those shown in FIG. 27 are denoted by the same reference numerals as those used in FIG. 27, and explanation of them is not repeated herein.

The imaging device 651 shown in FIG. 28 includes a glass wiring board 572, an imaging element 573, a sealing member 574, an active element 575, and a passive element 576.

The structure of the imaging device 651 differs from the structure of the imaging device 561 in not including the lens system 571, but in the other aspects, is substantially the same as the structure of the imaging device 561.

That is, the lens system 571 is not provided in the imaging device 651, and therefore, the opening 628, the pads 629, the pads 630, the adhesive member 631, and the like for securing the lens system 571 are not provided, either.

In such an imaging device 651, the imaging element 573 is also bump-connected directly to the conductive layer 613 located on the inner side of the outermost conductive layer 614, so that the imaging element 573 can be mounted on the glass wiring board 572 with high flatness and at low cost. Further, as the distance between the imaging element 573 and the core substrate 581 can be shortened, low-profile mounting can also be realized.

Twelfth Embodiment

<Example Structure of an Imaging Device>

Figure 29:
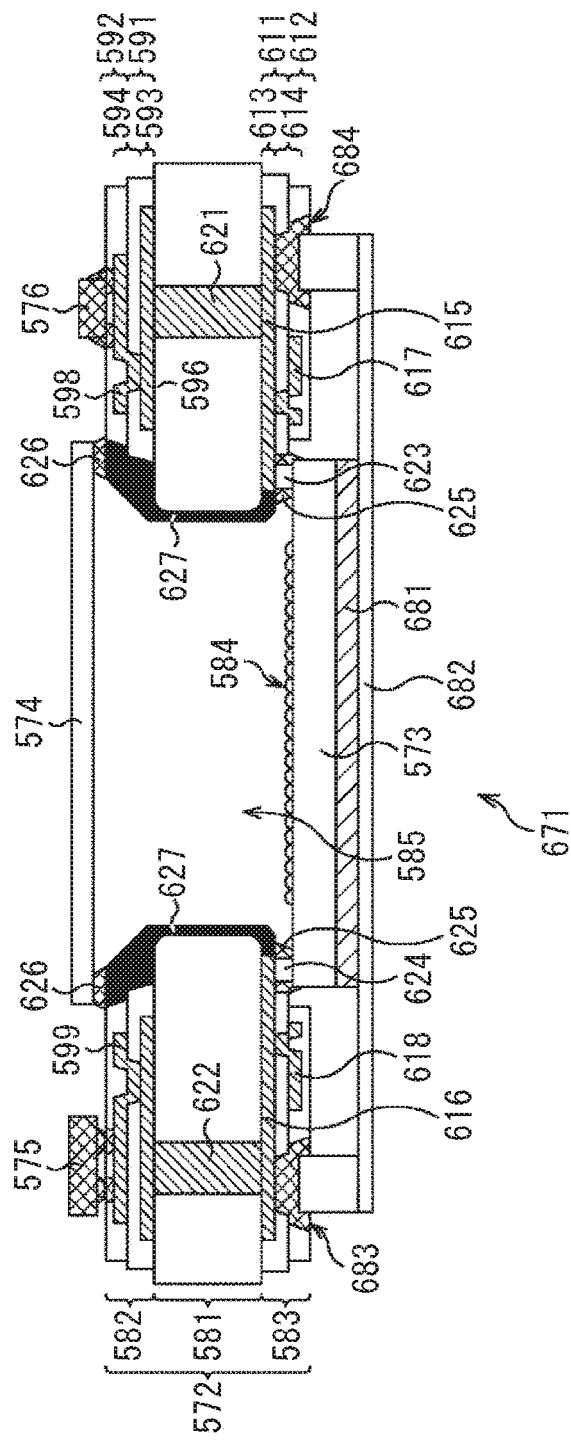
FIG. 29 is a diagram showing another example structure of an imaging device.

Alternatively, a heat release plate may be secured to the surface of an imaging element on the opposite side from the light receiving portion side. In such a case, an imaging device to which the present technology is applied is designed as shown in FIG. 29, for example. It should be noted that, in FIG. 29, the components equivalent to those shown in FIG. 28 are denoted by the same reference numerals as those used in FIG. 28, and explanation of them will not be unnecessarily repeated.

The structure of an imaging device 671 shown in FIG. 29 differs from the imaging device 651 shown in FIG. 28 in that a high heat release material 681 and a heat release plate 682 are newly provided, but in the other respects, is the same as the structure of the imaging device 651.

That is, in the imaging device 671, the high heat release material 681 formed with a thermal interface material (TIM) or the like is disposed adjacent to the surface of the imaging element 573 on the opposite side from the surface on the side of the light receiving portion 584.

In addition, the heat release plate 682 includes Cu or the like, for example, and is attached to the imaging element 573 with the high heat release material 681. That is, in the imaging device 671, the high heat release material 681 is disposed between the imaging element 573 and the heat release plate 682.

Further, the heat release plate 682 is secured (connected) to the glass wiring board 572 with a solder, an adhesive, or the like at the portions of an opening 683 and an opening 684 that penetrate through the outermost insulating layer 612 and part of the insulating layer 611. It should be noted that part of the heat release plate 682 may be electrically connected to the glass wiring board 572 via a solder or the like provided at the portions of in the opening 683 and the opening 684.

As the high heat release material 681 and the heat release plate 682 are provided in the imaging device 671 as described above, heat generated in the imaging element 573 can be efficiently released.

Thirteenth Embodiment

<Example Structure of an Imaging Device>

Further, in a case where a high heat release material and a heat release plate are provided in an imaging device, any opening may not be formed in a portion of the core substrate.

Figure 30:
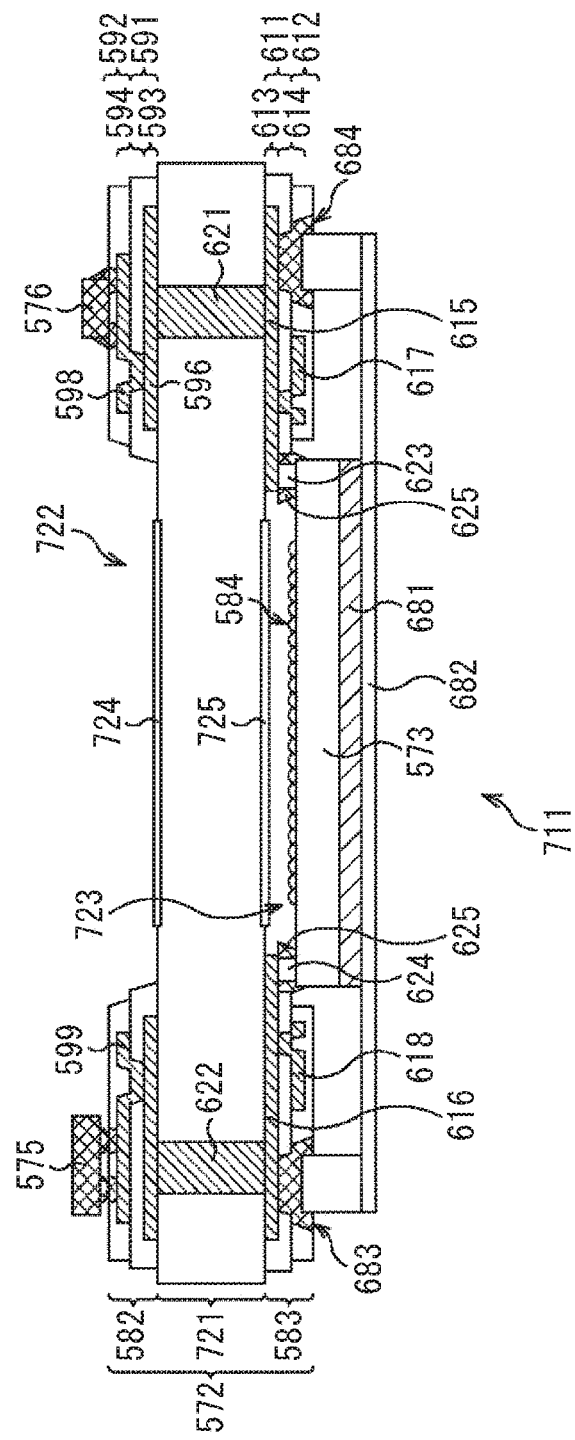
FIG. 30 is a diagram showing another example structure of an imaging device.

In such a case, an imaging device to which the present technology is applied is designed as shown in FIG. 30, for example. It should be noted that, in FIG. 30, the components equivalent to those shown in FIG. 29 are denoted by the same reference numerals as those used in FIG. 29, and explanation of them will not be unnecessarily repeated.

An imaging device 711 shown in FIG. 30 includes a glass wiring board 572, an imaging element 573, an active element 575, a passive element 576, a high heat release material 681, and a heat release plate 682.

That is, the structure of the imaging device 711 differs from the structure of the imaging device 671 shown in FIG. 29 in not including the sealing member 574 and the opening 585, but in the other aspects, is basically the same as the structure of the imaging device 671.

In the imaging device 711, instead of the core substrate 581 shown in FIG. 29, a core substrate 721 having no opening is provided in the glass wiring board 572. For example, the core substrate 721 is a transparent plate-like member including borosilicate glass or the like, and transmits light entering from the outside to the light receiving portion 584 of the imaging element 573.

Also, in the portions of the wiring layer 582 and the wiring layer 583 facing the light receiving portion 584 of the imaging element 573, an opening 722 and an opening 723 are formed, so that the core substrate 721 is exposed. Through the opening 722 and the opening 723, the imaging element 573 can receive light from the outside.

That is, the opening 722 functions as a light passing opening for guiding light entering from the outside to the core substrate 721. The opening portion 723 also functions as a light passing opening that guides light that has entered from the outside and passed through opening 722 and the light-transmissive core substrate 721, to the light receiving portion 584 of the imaging element 573.

Further, at the portion of the surface of the core substrate 721 facing the light receiving portion 584 on the side of the opening portion 722, an antireflective portion 724 formed with an antireflective film or the like that prevents reflection of incident light is provided. Likewise, at the portion of the surface of the core substrate 721 facing the light receiving portion 584 on the side of the opening portion 723, an antireflective portion 725 formed with an antireflective film or the like that prevents reflection of incident light is provided. As the antireflective portion 724 and the antireflective portion 725 are provided, occurrence of flare due to reflection of light entering from the outside by the surface of the core substrate 721 can be prevented.

It is to be noted that the embodiments and the modifications described so far may be combined as appropriate.

<Example Structure of an Imaging Device>

Further, the present technology can be applied to any electronic apparatus using a solid-state imaging device equivalent to the above described imaging device 121 as the photoelectric converter, such as an imaging apparatus like a digital still camera or a video camera, a mobile terminal device having an imaging function, or a copying machine using a solid-state imaging device as the image reader.

Figure 31:
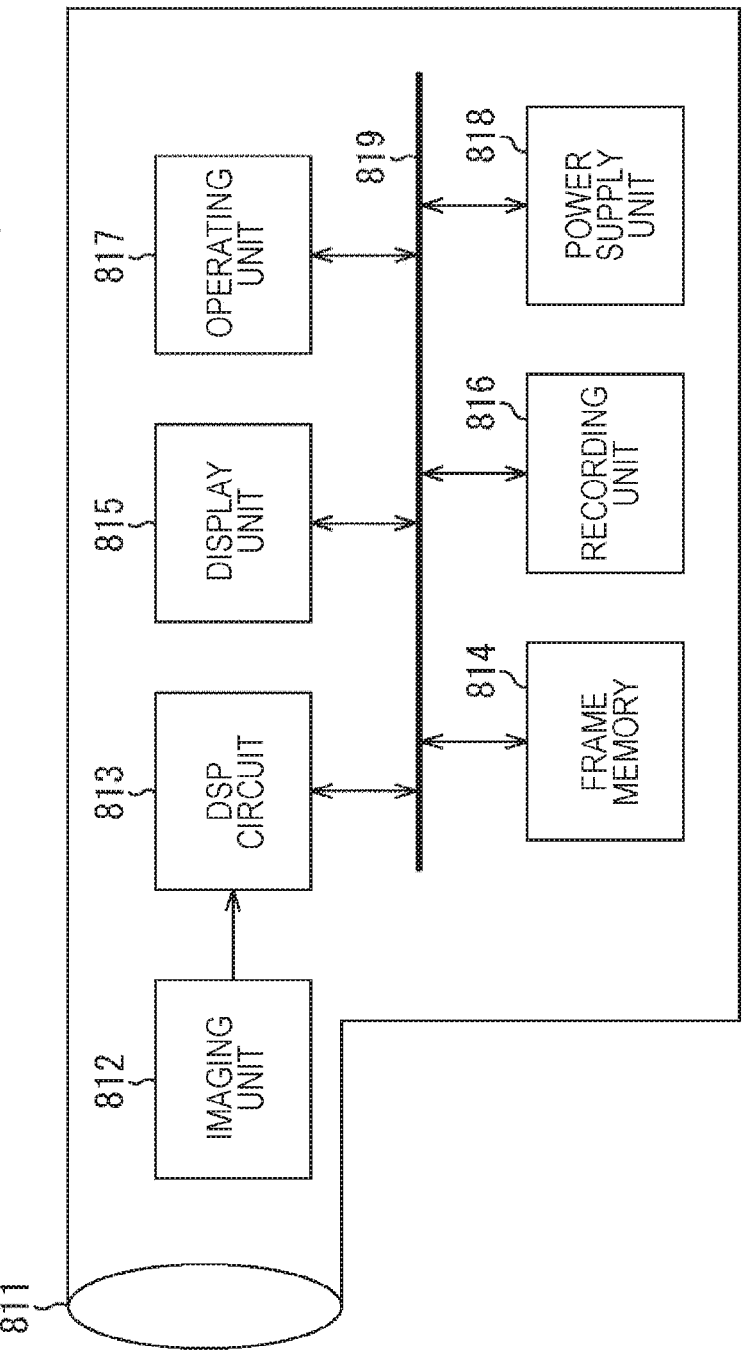
FIG. 31 is a diagram showing an example structure of an imaging apparatus to which the present technology is applied.

FIG. 31 is a diagram showing an example structure of an imaging apparatus as an electronic apparatus to which the present technology is applied.

The imaging apparatus 801 shown in FIG. 31 includes an optical system 811 including a lens group and the like, an imaging unit 812, a digital signal processor (DSP) circuit 813, a frame memory 814, a display unit 815, a recording unit 816, an operating unit 817, and a power supply unit 818. Further, the components from the DSP circuit 813 to the power supply unit 818 are connected to one another via a bus line 819.

The optical system 811 gathers incident light (image light) from the object, and forms an image on the imaging surface of the imaging unit 812. The imaging unit 812 converts the amount of the incident light, which has been gathered as the image on the imaging surface by the optical system 811, into an electrical signal for each pixel, and outputs the electrical signal as a pixel signal. The imaging unit 812 is equivalent to the imaging device 121 shown in FIG. 3, for example.

The DSP circuit 813 processes a signal from the imaging unit 812. For example, the DSP circuit 813 processes a signal from each pixel obtained through imaging performed by the imaging unit 812, and performs processing to load the signal into the frame memory 814.

The display unit 815 is formed with a liquid crystal panel or an organic electro-luminescence (EL) panel, and displays a moving image or a still image formed by the imaging unit 812. The recording unit 816 records a moving image or a still image formed by the imaging unit 812 on a recording medium such as a digital versatile disk (DVD).

When operated by a user, the operating unit 817 issues operating instructions as to various functions of the imaging apparatus 801. The power supply unit 818 supplies various power sources as the operation power sources for the DSP circuit 813, the frame memory 814, the display unit 815, the recording unit 816, and the operating unit 817, as appropriate.

<Usage Examples of a Solid-State Imaging Device>

Figure 32:
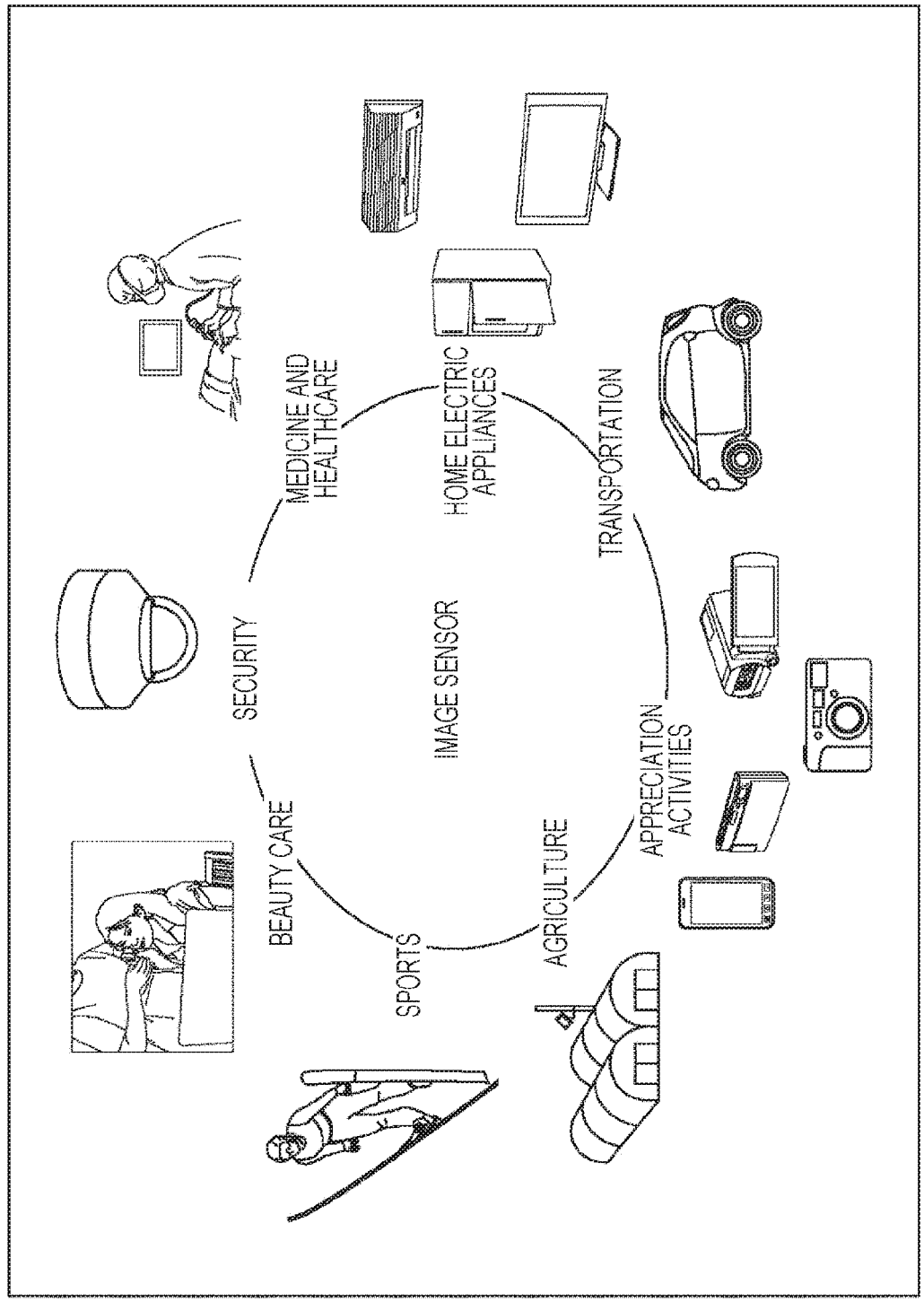
FIG. 32 is a diagram showing usage examples of a solid-state imaging device.

FIG. 32 is a diagram showing examples of use of a solid-state imaging device (an image sensor) such as the imaging device 121 described above.

The above described solid-state imaging device can be used in various cases where light such as visible light, infrared light, ultraviolet light, or an X-ray is sensed, as described below, for example.

Devices configured to take images for appreciation activities, such as digital cameras and portable devices with camera functions.

Devices for transportation use, such as vehicle-mounted sensors configured to take images of the front, the back, the surroundings, the inside and the like of an automobile to perform safe driving like an automatic stop, recognize a driver's condition and the like, surveillance cameras for monitoring running vehicles and roads, and ranging sensors for measuring distances between vehicles or the like.

Devices to be used in conjunction with home electric appliances, such as television sets, refrigerators, and air conditioners, to take images of gestures of users and operate the appliances in accordance with the gestures.

Devices for medical care use and health care use, such as endoscopes and devices for receiving infrared light for angiography.

Devices for security use, such as surveillance cameras for crime prevention and cameras for personal authentication.

Devices for beauty care use, such as skin measurement devices configured to image the skin and microscopes for imaging the scalp.

Devices for sporting use, such as action cameras and wearable cameras for sports.

Devices for agricultural use such as cameras for monitoring conditions of fields and crops.

Further, embodiments of the present technology are not limited to the above described embodiments, and various modifications may be made to them without departing from the scope of the present technology.

Further, the present technology may also be embodied in the configurations described below.

(1)

A method of manufacturing a semiconductor device, the semiconductor device including:

a core substrate;

a multilayer wiring layer including a plurality of conductive layers and a plurality of insulating layers, the multilayer wiring layer being formed on a surface of the core substrate;

an opening formed in the multilayer wiring layer, the opening penetrating through at least the outermost insulating layer farthest from the core substrate among the plurality of insulating layers; and a mount element connected to a pad portion provided on a predetermined conductive layer located closer to the core substrate than the outermost conductive layer farthest from the core substrate among the plurality of conductive layers in the opening, the method including the steps of:

forming a resist pattern on a seed metal formed on an adjacent insulating layer so that a resist is applied to an opening portion formed in the adjacent insulating layer adjacent to the predetermined conductive layer;

forming a conductive layer adjacent to the predetermined conductive layer by removing the seed metal on the adjacent insulating layer including the opening portion, after plating is performed and the resist is removed; and forming the opening after the outermost insulating layer is formed.

(2)

The method according to (1), further including the step of forming a protective resin at a connecting portion between the mount element and the pad in the opening, the protective resin protecting the connecting portion.

(3)

The method according to (2), in which the opening in a groove-like shape is formed in the multilayer wiring layer so as to surround a region facing the mount element.

(4)

The method according to (3), in which a plurality of the openings are formed in the multilayer wiring layer so as to surround the region facing the mount element, and an air passage is formed between the openings adjacent to each other, the region surrounded by the opening and facing the mount element being connected to the outside by the air passage.

(5)

The method according to (4), in which the air passage is sealed with another resin different from the protective resin.

(6)

The method according to (4), in which the mount element is an imaging element, the core substrate is formed with a material having light transmission properties, the imaging element is connected to the pad portion so that a light receiving portion of the imaging element faces the core substrate, and a light passing opening that guides light entering from the outside and passing through the core substrate to the light receiving portion of the imaging element is formed at a portion of the multilayer wiring layer, the portion facing the imaging element.

(7)

The method according to (6), in which the region facing the imaging element surrounded by the opening is filled with a transparent resin.

(8)

The method according to any of (1) to (7), in which the mount element and the pad are connected by bump connection.

(9)

The method according to any of (1) to (8), in which a thickness of one of the insulating layers forming the multilayer wiring layer is greater than a thickness of the other insulating layer(s) forming the multilayer wiring layer.

(10)

A semiconductor device including:

a core substrate:

a multilayer wiring layer including a plurality of conductive layers and a plurality of insulating layers, the multilayer wiring layer being formed on a surface of the core substrate;

an opening formed in the multilayer wiring layer, the opening penetrating through at least the outermost insulating layer farthest from the core substrate among the plurality of insulating layers; and a mount element connected to a pad portion provided on a predetermined conductive layer located closer to the core substrate than the outermost conductive layer farthest from the core substrate among the plurality of conductive layers in the opening.

(11)

The semiconductor device according to (10), in which a protective resin that protects a connecting portion between the mount element and the pad in the opening is formed at the connecting portion.

(12)

The semiconductor device according to (11), in which the opening in a groove-like shape is formed in the multilayer wiring layer so as to surround a region facing the mount element.

(13)

The semiconductor device according to (12), in which a plurality of the openings are formed in the multilayer wiring layer so as to surround the region facing the mount element, and an air passage connecting the region surrounded by the opening and facing the mount element to the outside is formed between the openings adjacent to each other.

(14)

The semiconductor device according to (13), in which the air passage is sealed with another resin different from the protective resin.

(15)

The semiconductor device according to (13), in which the mount element is an imaging element.

(16)

The semiconductor device according to (15), in which the core substrate is formed with a material having light transmission properties, the imaging element is connected to the pad portion so that a light receiving portion of the imaging element faces the core substrate, a light passing opening that guides light entering from the outside and passing through the core substrate to the light receiving portion of the imaging element is formed at a portion of the multilayer wiring layer, the portion facing the imaging element.

(17)

The semiconductor device according to (16), in which the region facing the imaging element surrounded by the opening is filled with a transparent resin.

(18)

The semiconductor device according to any of (10) to (17), in which the mount element and the pad are connected by bump connection.

(19)

The semiconductor device according to any of (10) to (18), in which a thickness of one of the insulating layers forming the multilayer wiring layer is greater than a thickness of the other insulating layer(s) forming the multilayer wiring layer.

(20)

An electronic apparatus including:

a core substrate:

a multilayer wiring layer including a plurality of conductive layers and a plurality of insulating layers, the multilayer wiring layer being formed on a surface of the core substrate;

an opening formed in the multilayer wiring layer, the opening penetrating through at least the outermost insulating layer farthest from the core substrate among the plurality of insulating layers; and a mount element connected to a pad portion provided on a predetermined conductive layer located closer to the core substrate than the outermost conductive layer farthest from the core substrate among the plurality of conductive layers in the opening.

(21)

An imaging device including:

an imaging element;

a core substrate:

a multilayer wiring layer including a plurality of conductive layers and a plurality of insulating layers, the multilayer wiring layer being formed on a surface of the core substrate;

an opening formed in the multilayer wiring layer, the opening penetrating through at least the outermost insulating layer farthest from the core substrate among the plurality of insulating layers; and a lens system that guides incident light to the imaging element, the lens system being secured to the core substrate at a portion in the opening.

REFERENCE SIGNS LIST

51 Glass wiring board
52 Imaging element
61 Core substrate
62 Wiring layer
64 Microlens
71 Insulating layer
72 Insulating layer
73 Insulating layer
74 Conductive layer
75 Conductive layer
90 Opening
91 Protruding portion
94 Bump
95 Bump
121 Imaging device
133 Opening
134 Opening
139 Underfill
401 Protruding portion
431 Insulating layer film
461-1 to 461-4, 461 Opening
462-1 to 462-4, 462 Air passage
493 Transparent resin

The invention claimed is:

1. A semiconductor device, comprising:
a core substrate, wherein the core substrate comprises a material having light transmissive properties;
a multilayer wiring layer on a surface of the core substrate, wherein the multilayer wiring layer includes a plurality of conductive layers and a plurality of insulating layers;
an opening in the multilayer wiring layer, wherein
the opening penetrates through at least an outermost insulating layer of the plurality of insulating layers, and
the outermost insulating layer is farthest from the core substrate among the plurality of insulating layers;
a pad portion on a specific conductive layer of the plurality of conductive layers, wherein the specific conductive layer is closer to the core substrate than an outermost conductive layer farthest from the core substrate among the plurality of conductive layers in the opening;
a mount element connected to the pad portion, wherein
the mount element is an imaging element, and
the imaging element includes a light receiving portion that faces the core substrate; and
a protruding portion on the multilayer wiring layer, wherein
the protruding portion faces the mount element, and
the protruding portion is a portion of the outermost insulating layer.

2. The semiconductor device according to claim 1, further comprising a connecting portion between the mount element and the pad portion, wherein the connecting portion comprises a protective resin.

3. The semiconductor device according to claim 2, wherein
a shape of the opening is a groove-like shape,
the opening surrounds a region of the semiconductor device, and
the region faces the mount element.

4. The semiconductor device according to claim 3, wherein the region is filled with a transparent resin.

5. The semiconductor device according to claim 1, wherein the mount element and the pad portion are connected by a bump connection.

6. The semiconductor device according to claim 1, wherein a thickness of a specific insulating layer of the plurality of insulating layers is greater than a thickness of each insulating layer of the plurality of insulating layers other than the specific insulating layer.

* * * * *